United States Patent
Lee et al.

(10) Patent No.: US 8,378,395 B2
(45) Date of Patent: Feb. 19, 2013

(54) METHODS OF FABRICATING FIELD EFFECT TRANSISTORS HAVING PROTRUDED ACTIVE REGIONS

(75) Inventors: Ji-Young Lee, Seoul (KR); Jun Seo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 12/977,811

(22) Filed: Dec. 23, 2010

(65) Prior Publication Data
US 2011/0095345 A1    Apr. 28, 2011

Related U.S. Application Data

(63) Continuation of application No. 12/639,118, filed on Dec. 16, 2009, now Pat. No. 7,863,137.

(30) Foreign Application Priority Data

Jul. 10, 2007    (KR) .................. 10-2007-0069349

(51) Int. Cl.
H01L 29/78    (2006.01)
(52) U.S. Cl. ............................ 257/288; 257/E29.255
(58) Field of Classification Search .............. 257/288, 257/E29.255
See application file for complete search history.

(56) References Cited

U.S. PATENT DOCUMENTS

| | | | |
|---|---|---|---|
| 7,354,828 B2 * | 4/2008 | Cho | 438/270 |
| 2007/0246783 A1 * | 10/2007 | Moon et al. | 257/384 |
| 2008/0246081 A1 | 10/2008 | Li et al. | |
| 2009/0032866 A1 | 2/2009 | McDaniel | |
| 2010/0093146 A1 | 4/2010 | Jang et al. | |
| 2010/0190325 A1 | 7/2010 | Kim | |

FOREIGN PATENT DOCUMENTS

| | | |
|---|---|---|
| JP | 2000-077659 | 3/2000 |
| KR | 1020050015975 A | 2/2005 |
| KR | 1020050108916 A | 11/2005 |

* cited by examiner

*Primary Examiner* — Calvin Lee
*Assistant Examiner* — Monica D Harrison
(74) *Attorney, Agent, or Firm* — Myers Bigel Sibley & Sajovec

(57) ABSTRACT

Provided are a field effect transistor, a method of manufacturing the same, and an electronic device including the field effect transistor. The field effect transistor may have a structure in which a double gate field effect transistor and a recess channel array transistor are formed in a single transistor in order to improve a short channel effect which occurs as field effect transistors become more highly integrated, a method of manufacturing the same, and an electronic device including the field effect transistor. The field effect transistor can exhibit stable device characteristics even when more highly integrated in such a manner that both the length and width of a channel increase and particularly the channel can be significantly long, and can be manufactured simply.

19 Claims, 22 Drawing Sheets

METHODS OF FABRICATING FIELD EFFECT TRANSISTORS HAVING PROTRUDED ACTIVE REGIONS

CROSS-REFERENCE TO RELATED PATENT APPLICATIONS

This application claims priority under 35 U.S.C. §120 as a continuing application of U.S. patent application Ser. No. 12/639,118, filed Dec. 16, 2009, now U.S. Pat. No. 7,863,137, which in turn claims priority to U.S. patent application Ser. No. 12/170,537, filed Jul. 10, 2008, which in turn claims the benefit under 35 U.S.C. §119 of Korean Patent Application No. 10-2007-0069349, filed on Jul. 10, 2007, in the Korean Intellectual Property Office, the disclosures of each of which are incorporated herein in there entireties by reference.

FIELD OF THE INVENTION

The present invention relates to semiconductor devices and, more particularly, to field effect transistors and to methods of fabricating such transistors.

BACKGROUND

As the performance, operating speed and integration of semiconductor devices increase and as their power consumption decrease, several problems may appear related to the properties of transistors. For example, a short channel effect may arise as the length of the channel of a field effect transistor is decreased. Such short channel effects may lead to problems such as difficulty in adjusting the threshold voltage of the transistor, an increase in leakage current, and the like. A gate insulation layer or metallic gate that has a high dielectric constant and/or a semiconductor on insulator (SOI) semiconductor substrate (instead of a bulk semiconductor substrate) have been used in efforts to mitigate these problems.

To further address these problems, double gate field effect transistors and recess channel array transistors have also been proposed. Recess channel array transistors address the decrease in the length of a channel that naturally occurs as the integration of a device is increased by providing a recess channel trench in the region that is to be the channel of the transistor. This recess channel trench increases the length of the channel. Double gate field effect transistors have a structure in which gates are disposed on both sides of a channel, and thus the electric potential of the channel can be effectively adjusted and, for example, can be applied in Fin field effect transistors (Fin-FET).

SUMMARY

Embodiments of the present invention provide field effect transistors which may have stable device characteristics even when highly integrated, and which may be easy to manufacture. Embodiments of the present invention also provides a method of manufacturing the field effect transistor which has stable device characteristics even when highly integrated, and is simple to manufacture.

Pursuant to some embodiments of the present invention, methods of manufacturing a field effect transistor are provided in which a first hard mask pattern is formed on a semiconductor substrate. The semiconductor substrate is etched using the first hard mask pattern as an etching mask to define an active region. A device isolation film is then formed on the semiconductor substrate. A second hard mask pattern is formed on the first hard mask pattern and device isolation film. Portions of the semiconductor substrate and the device isolation film are then anisotropically etched using the second hard mask pattern as an etching mask. Thereafter, the active region is isotropically etched. A gate insulation layer is formed on the active region and then a gate electrode is formed on the gate insulation layer.

In some embodiments, the active region may extend in a first direction and may have a top surface that is higher than the top surfaces of the semiconductor substrate on either side of the active region. The gate electrode may cover a top surface and first and second side surfaces of the active region. Portions of the first hard mask pattern that are not covered by the second hard mask pattern may be removed during the anisotropic etching of the semiconductor substrate and the device isolation film. The anisotropic etching of the semiconductor substrate and the device isolation film may create a first opening that exposes a first side surface of the active region and a second opening that exposes a second side surface of the active region while leaving a portion of the device isolation film under both the first and second openings. A top surface of a terminal edge of a lower portion of the active region may be positioned below a top surface of the portion of the device isolation film that is under the first opening.

In some embodiments, the anisotropic etching may etch the portions of the active region that are not covered by the second hard mask pattern to a predetermined depth. The gate electrode may be formed using the first hard mask pattern as a stopping layer using damascene. The width of the opening in the first hard mask pattern above the active region may be wider than the width of the opening in the first hard mask pattern above the device isolation film. Moreover, the isotropic etching may be performed until the width of the active region is substantially the same as the width of the device isolation film.

In some embodiments, forming the gate electrode may comprise depositing a gate material film on the first hard mask pattern, the semiconductor substrate and the device isolation film and then planarizing the gate material film using the first hard mask pattern as a stopping layer. The methods may also further include (1) back-etching the gate electrode to a predetermined depth, (2) depositing a capping material on a top surface of the gate electrode and (3) planarizing the capping material using the first hard mask pattern as a stopping layer. In still other embodiments, the methods may include (1) removing the first hard mask pattern, (2) forming an insulation layer on the gate electrode, the semiconductor substrate and the device isolation film and (3) isotropically etching the insulation layer to form a spacer.

Pursuant to further embodiments of the present invention, field effect transistors are provided that include a semiconductor substrate. An active region is provided in the semiconductor substrate. The active region has a top surface and side surfaces and extends in a first direction. The transistors further include a device isolation film that extends along the first direction, as well as a gate electrode that covers the top and side surfaces of the active region and extends in a second direction. In these transistors, portions of the active region that are covered by the gate electrode are recessed below a top surface of the semiconductor substrate.

In some embodiments, portions of the active regions that are covered by the gate electrode have curved surfaces. The curved surfaces may form a saddle shape. The width in the first direction of the portion of the gate electrode that is on the active region may be greater than the width in the first direction of the portion of the gate electrode that is on the device isolation film. The gate electrode may be self-aligned with side surfaces of portions of the active region that are not etched. Terminal edges of the contact surfaces between the gate electrode and the active region may be formed between the active region and the device isolation film.

Pursuant to still further embodiments of the present invention, field effect transistors are provided that include a semiconductor substrate and a plurality of active regions that protrude from a surface of the semiconductor substrate and extend in a first direction. These transistors further include a plurality of device isolation films that extend along the first direction and separate the field effect transistors from each other and a plurality of gate electrodes that each cover a top surface and side surfaces of a respective one of the plurality of protruded active regions. The gate electrodes extend in a second direction. A top surface of the portions of each active region that are covered by the gate electrodes is lower than a top surface of the portions of the active region that are between adjacent gate electrodes.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
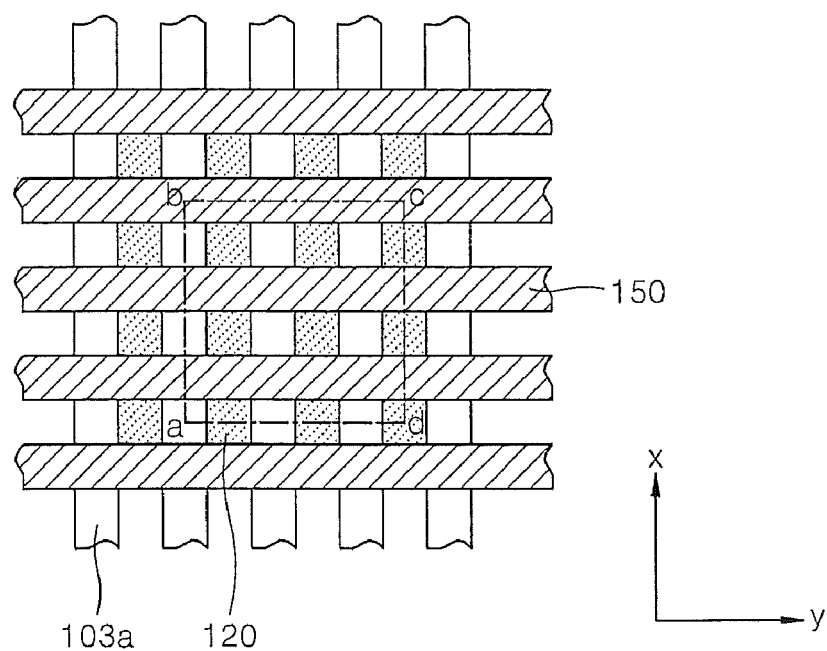
FIG. 1 is a plan view that conceptually illustrates an array of field effect transistors according to embodiments of the present invention.

Hereinafter, embodiments of the present invention will be described in more detail with reference to the accompanying drawings. However, the present invention may be embodied in many different forms and should not be construed as being limited to the embodiments set forth herein. Rather, these embodiments are provided so that this disclosure will be thorough and complete, and will fully convey the scope of the invention to those skilled in the art. The same reference numerals refer to the same elements throughout the drawings. Further, a variety of elements and regions in the drawings are illustrated schematically. Thus, the present invention is not limited to the relative sizes or intervals shown in the accompanying drawings. It will also be understood that when a layer is referred to as being "on" another layer or element, it can be directly on the other layer or element, or intervening layers or elements may also be present. It will also be understood that the term "semiconductor substrate" encompasses traditional bulk substrates as well as semiconductor-on-insulator substrates, epitaxial grown semiconductor layers, and the like.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Embodiments of the present invention provide field effect transistors that comprise a semiconductor substrate; an active region that protrudes from a surface of the semiconductor substrate and extends in a first direction; a device isolation film that extends along the first direction and defines the boundaries of devices; and a gate electrode that covers the protruding active region and extends in a second direction, wherein the active region is conformally recessed to a predetermined depth for all contact surfaces between the active region and the gate electrode.

Figure 2:
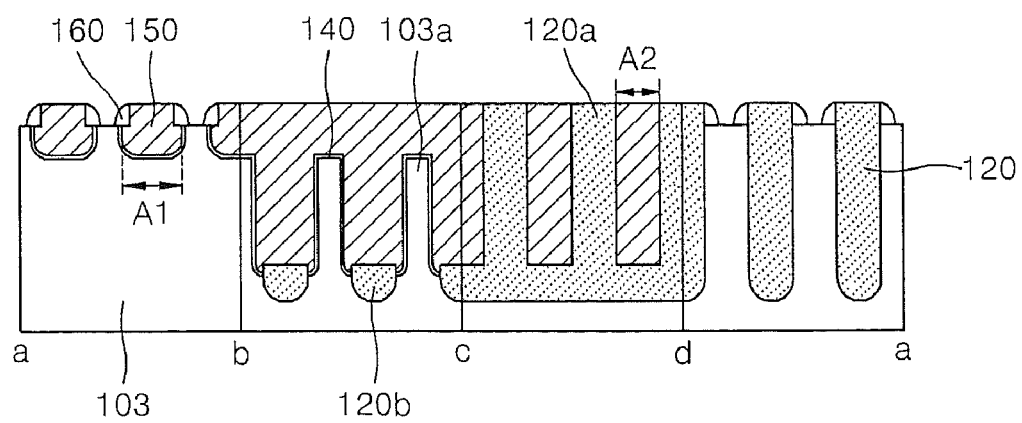
FIG. 2 is a cross-sectional view of the array of field effect transistors of FIG. 1 taken along line a-b-c-d-a of FIG. 1.

FIG. 1 is a plan view conceptually illustrating an array of field effect transistors according to embodiments of the present invention. FIG. 2 is a cross-sectional view of the array of field effect transistors of FIG. 1 taken along line a-b-c-d-a of FIG. 1.

Referring to FIG. 2, the array of field effect transistors includes active regions 103a that extend in a first direction (the x direction of FIG. 1). As shown in FIG. 2, the active regions 103a protrude from a semiconductor substrate 103. The active regions 103a are isolated from each other by device isolation layers 120, 120a and 120b. As shown best in FIG. 1, the device isolation layers 120, 120a and 120b each extend in the first direction (the x direction).

A gate electrode 150 covers the protruded active regions 103a. As shown best in FIG. 1, the gate electrode 150 extends in a second direction (the y direction of FIG. 1). As shown in FIG. 2, the gate electrode 150 may be on the top and side surfaces of the protruded active regions 103a. Portions of the active regions 103a that are covered by the gate electrode 150 may be conformally recessed to a predetermined depth from a top surface of the semiconductor substrate. The gate electrode 150 may comprise, for example, polysilicon, tungsten, or other metallic materials.

Figure 3:
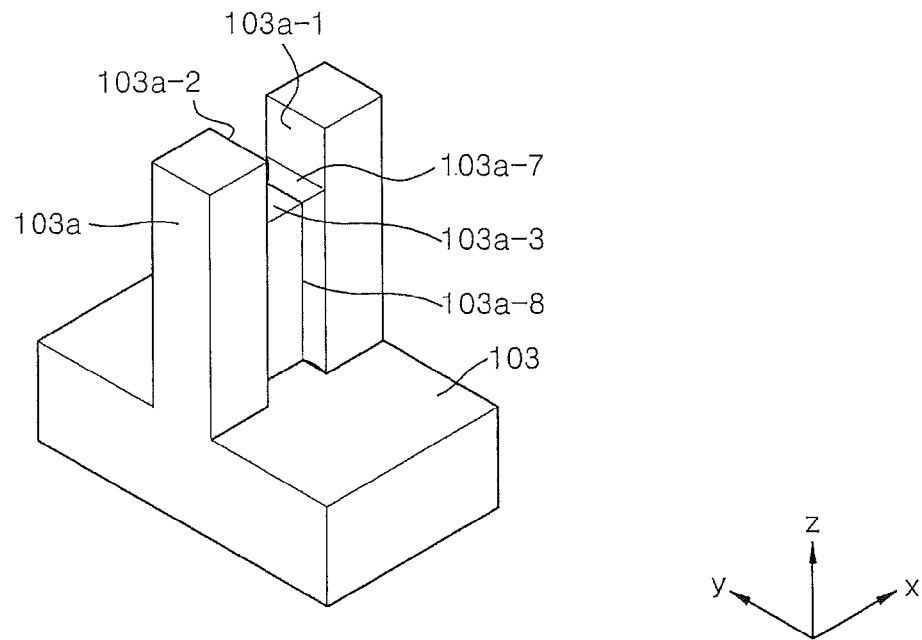
FIG. 3 is a schematic perspective view that conceptually illustrates an active region of a field effect transistor according to certain embodiments of the present invention.

FIG. 3 is a schematic diagram that conceptually illustrates certain characteristics of the semiconductor substrate 103 and the active regions 103a in order to further explain the contact relationship (through the gate dielectric layer 140) between the gate electrode 150 and the active regions 103a. As shown in FIG. 3, the active region 103a extends in the x direction and protrudes from the semiconductor substrate 103. As will be explained in greater detail herein, the portion of the active region 103a that contacts the gate electrode (not shown) through the gate dielectric layer 140 is recessed to a predetermined depth.

As shown in FIG. 3, the active region 103a includes a recessed portion 103a-3 that is between two un-recessed portions, 103a-1 and 103a-2. A first side surface of the first un-recessed portion 103a-1 and a first side surface of the second un-recessed portion 103a-2 may face each other, and may connect with a top surface of the recessed portion 103a-3. The recessed portion 103a-3 is formed such that the active region 103a is conformally recessed from left, right and upper sides based on the side surface of un-recessed portion 103a-1. Thus, the recessed depths of the active region 103a from the sides can be all the same.

Figure 8:
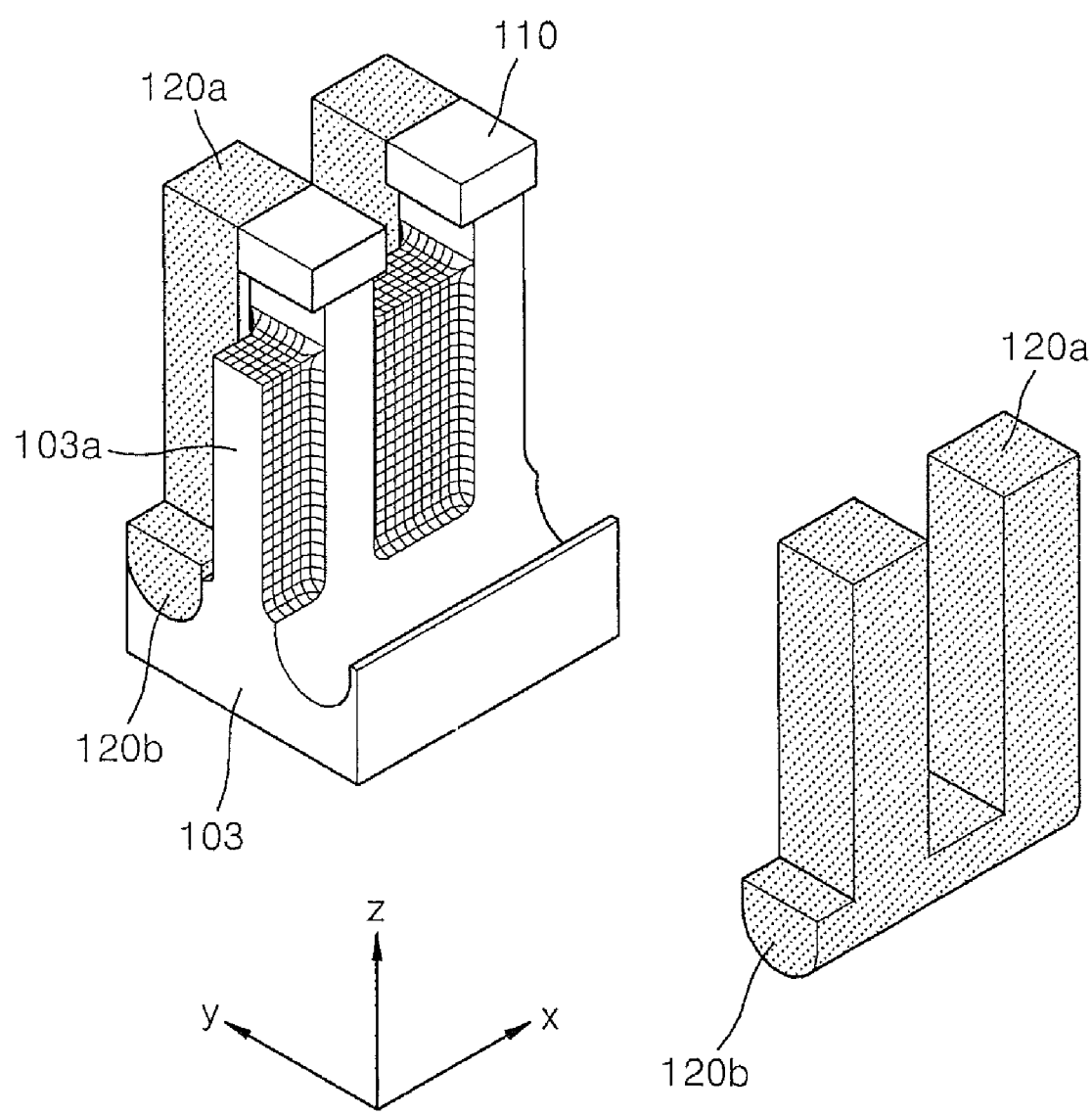
FIG. 8 is an exploded perspective view of a portion of the structure of FIG. 6I.

Optionally, a first contact surface 103a-7 that connects the first side surface of the first un-recessed portion 103a-1 and the first side surface of the second un-recessed portion 103a-2 with the top surface of the recessed portion 103a-3 of the active region 103a may be in a smooth curved form (also see FIG. 8). The first contact surface 103a-7 may connect the first side surface of un-recessed portion 103a-1 and the first side surface of un-recessed portion 103a-2 with the top surface of recessed portion 103a-3 in a concave curved form with respect to the +z direction.

In addition, second contact surfaces 103a-8 that connect the first side surface of un-recessed portion 103a-1 and the first side surface of un-recessed portion 103a-2 with side surfaces of the recessed portion 103a-3 may have smooth curved forms, and a portion of the second surface 103a-2 that is connected with the surface sides may itself be a part of the smooth curved surface. Therefore, the second contact surfaces 103a-8 may connect the first side surface of un-recessed portion 103a-1 and the first side surface of un-recessed portion 103a-2 with the side surfaces of the recessed portion 103a-3 in a concave curved form with respect to the +y or −y direction.

Thus, the first contact surface 103a-7 is in a downward concave form, and the second contact surface 103a-8 is in a concave form in a direction perpendicular to the direction of the concave form of the first contact surface 103a-7. Accordingly, the active region 103a has an overall saddle shape. This is also illustrated in FIG. 8 and described in greater detail herein.

As noted above, the gate electrodes 150 extend in a second direction (i.e., the y direction in FIG. 1). The width of the gate electrodes 150 in the first direction (i.e., in the x direction) may vary. For example, as shown in FIG. 2, the width "A2" of the portion of the gate electrode 150 formed on the device isolation layers 120b may be narrower than the width "A1" of the portion of the gate electrode 150 that is formed on the active regions 103a.

Figure 4A:
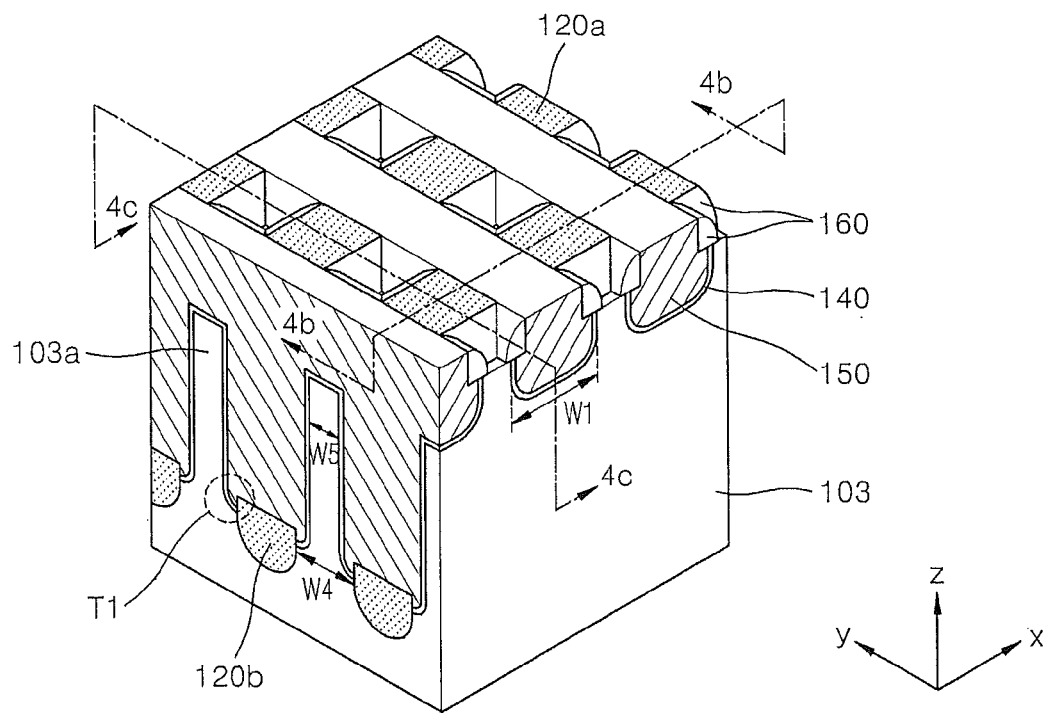
FIG. 4A is a perspective view taken along line a-b-c-d-a of FIG. 1.
Figure 4B:
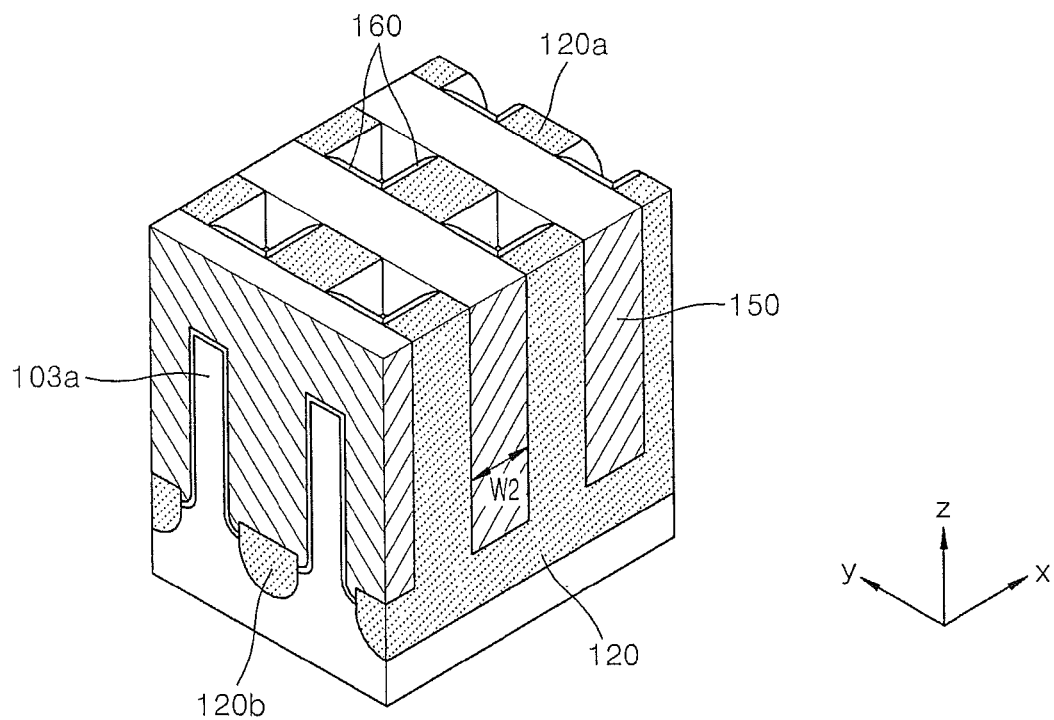
FIGS. 4B and 4C are perspective views taken along lines 4b-4b and 4c-4c of FIG. 4A, respectively.
Figure 4C:
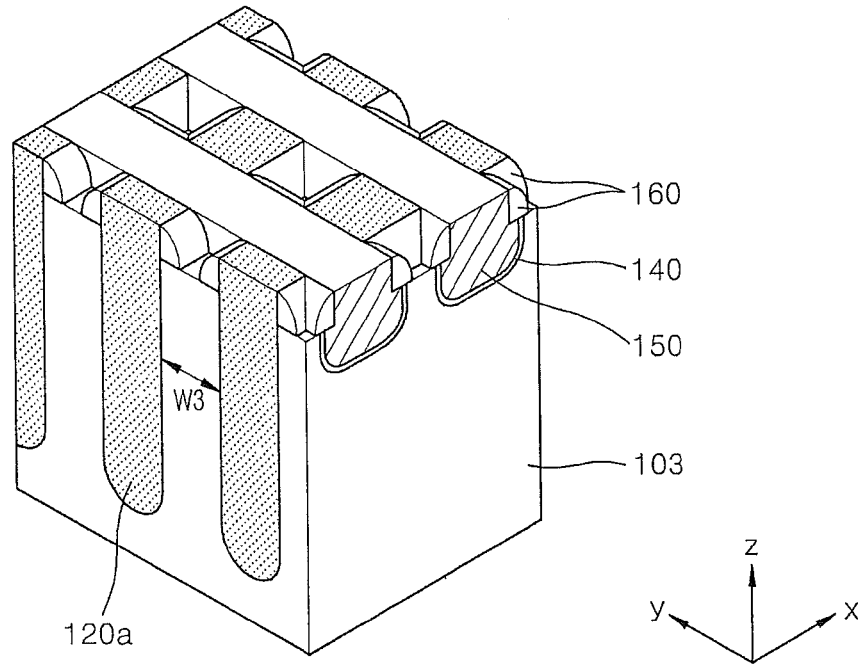

FIG. 4A is a perspective view of the array of field effect transistors of FIG. 1 taken along line a-b-c-d-a of FIG. 1. FIGS. 4B and 4C are perspective views taken along lines 4b-4b and 4c-4c of FIG. 4A, respectively. As shown in FIGS. 4A and 4B, the width "W1" in the first (x) direction of the portion of the gate electrodes 150 on the active regions 103a (see FIG. 4A) is greater than the width "W2" in the first (x) direction of the portion of the gate electrodes 150 on the isolation layers 120a (see FIG. 4B).

In addition, as shown in FIGS. 4A and 4C, the width "W3" in the second (y) direction of the portions of the active regions 103a between the device isolation layers 120 (see FIG. 4C) is the same as the width "W4" in the second (y) direction of lower portion of the active regions 103a that are between device isolation layers 120b (see FIG. 4A). However, the width "W5" of the upper portion of the active regions 103a (see FIG. 4A) is smaller than the width "W3" of the portions of the active regions 103a between the device isolation layers (see FIG. 4C).

As illustrated in FIG. 4A, terminal edges (T1 of FIG. 4A) of the "contact surfaces" between the gate electrodes 150 and the active regions 103a (i.e., the areas where the gate electrode 150 would contact the active region 103a but for the presence of the gate dielectric layer 140) are located between the active regions 103a and the device isolation layers 120b. Although T1 of FIG. 4A is illustrated at only a lower terminal of the gate electrode 150, terminal edges (not shown) at side portions of the contact surfaces between the gate electrodes 150 and the active regions 103a may also be formed between the active regions 103a and the device isolation films 120a.

Figure 5A:
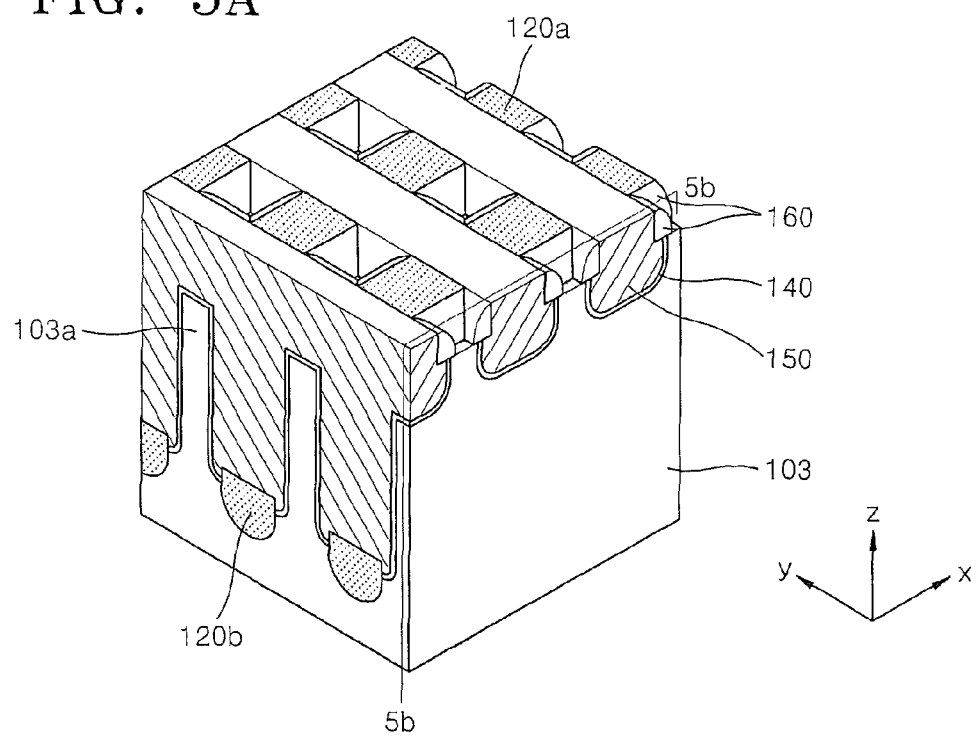
FIGS. 5A through 5G are perspective views illustrating cross-sections of the structure of FIG. 4A, taken sequentially along the y direction of FIG. 4A.

FIGS. 5A through 5G are perspective views illustrating various cross-sections of the structure of FIG. 4A, taken sequentially in a direction perpendicular to the second (y) direction. In particular, FIG. 5A is a perspective view of the array of field effect transistors of FIG. 1 taken along line a-b-c-d-a (and thus FIG. 5A is identical to FIG. 4A aside from various annotations and reference identifiers). FIGS. 5B through 5G are perspective views taken along lines 5b-5b through 5g-5g of FIGS. 5A through 5F, respectively.

Figure 5B:
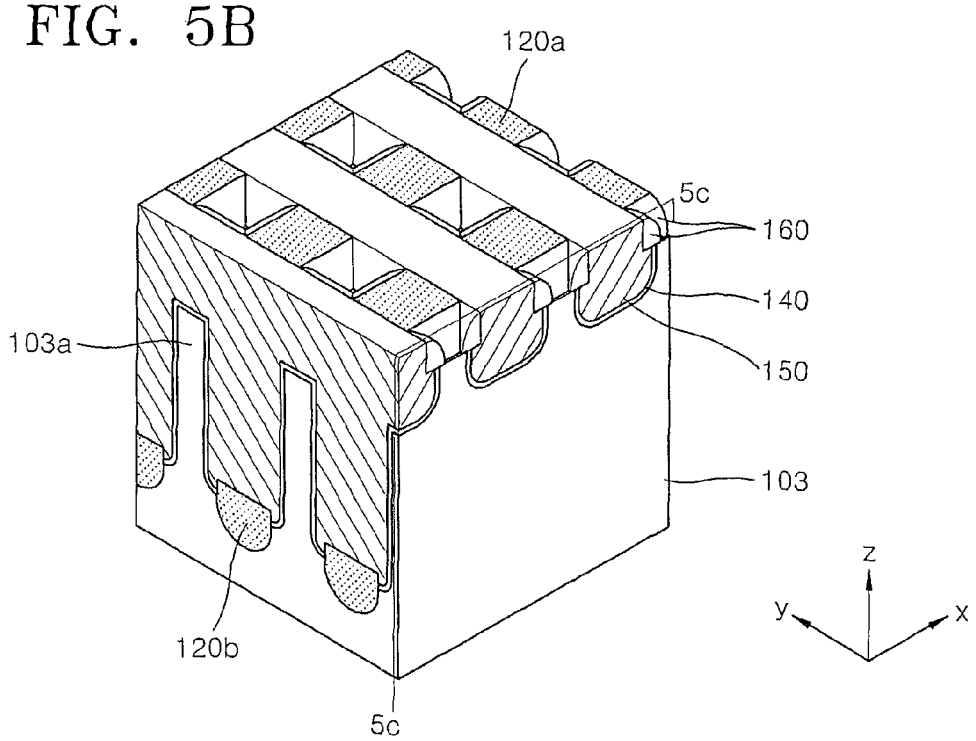
Figure 5C:
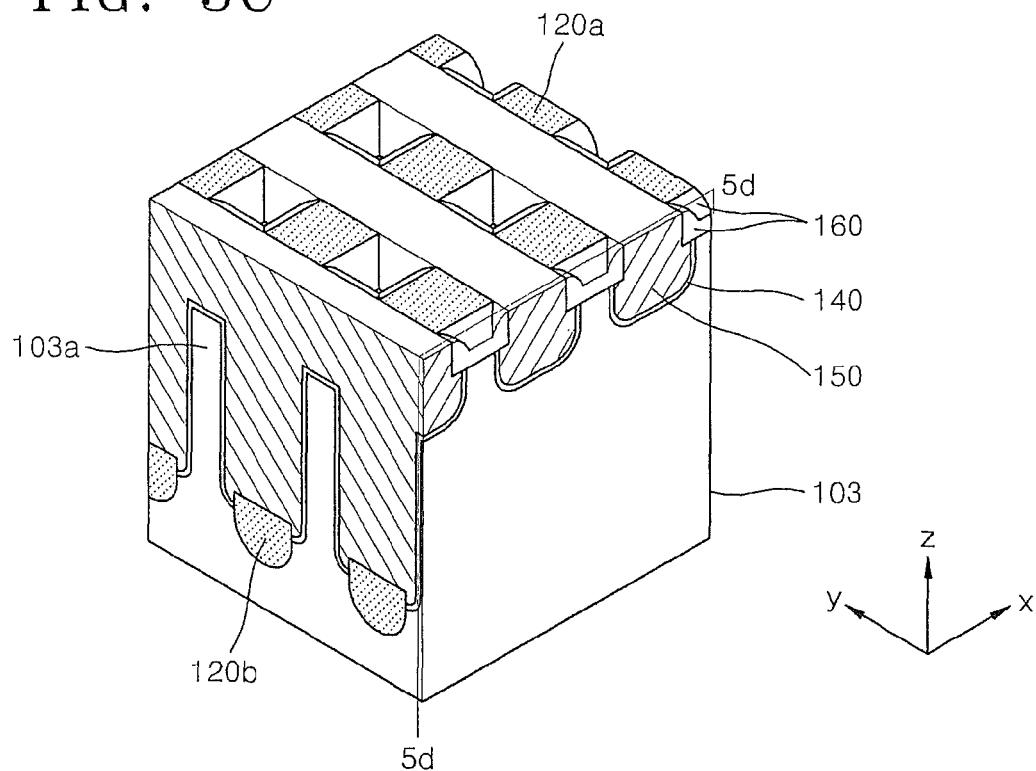

FIG. 5B illustrates a cross-section of the structure of FIG. 5A, where the cross-section is taken along the first (x) direction. FIG. 5C illustrates a second cross-section of the structure of FIG. 5A taken along the first (x) direction. The cross-section of FIG. 5C is taken deeper into the structure of FIG. 5A than is the cross-section of FIG. 5B. Referring to FIGS. 5B and 5C, the interface between the gate electrode 150 and the active region 103a in FIGS. 5B and 5C is almost the same as in FIG. 5A until the cross-sections taken along lines 5b-5b and 5c-5c contact the spacers 160 facing the cross-sections and are taken deeper to a predetermined depth. In a cross-section perpendicular to the second (y) direction, the gate insulation layer 140 is formed between the gate electrode 150 and the active region 103a. In the cross-section in the first (x) direction, the gate insulation layer 140 has a portion extending in the first direction and a portion extending in a direction perpendicular to the semiconductor substrate 103 (the z direction). The portion perpendicular to the semiconductor substrate 103 and the portion extending in the first (x) direction may be connected by a portion corresponding to a substantial quadrant.

Figure 5D:
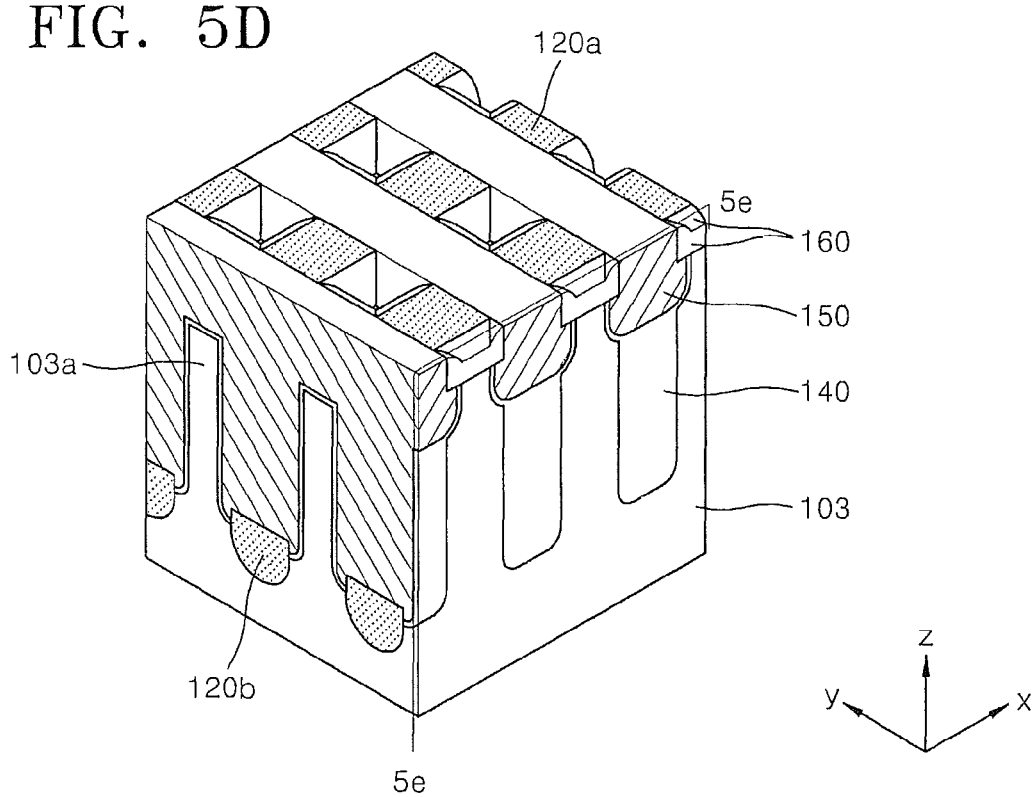

Line 5d-5d of FIG. 5C depicts a cross-sectional cut taken along the center of the gate insulation layer 140. FIG. 5D is a perspective view specifically illustrating a cross-section taken along line 5d-5d. As shown in FIG. 5D, the gate insulation layer 140 extends downward, thus separating the gate electrode 150 from the active region 103a.

Figure 5E:
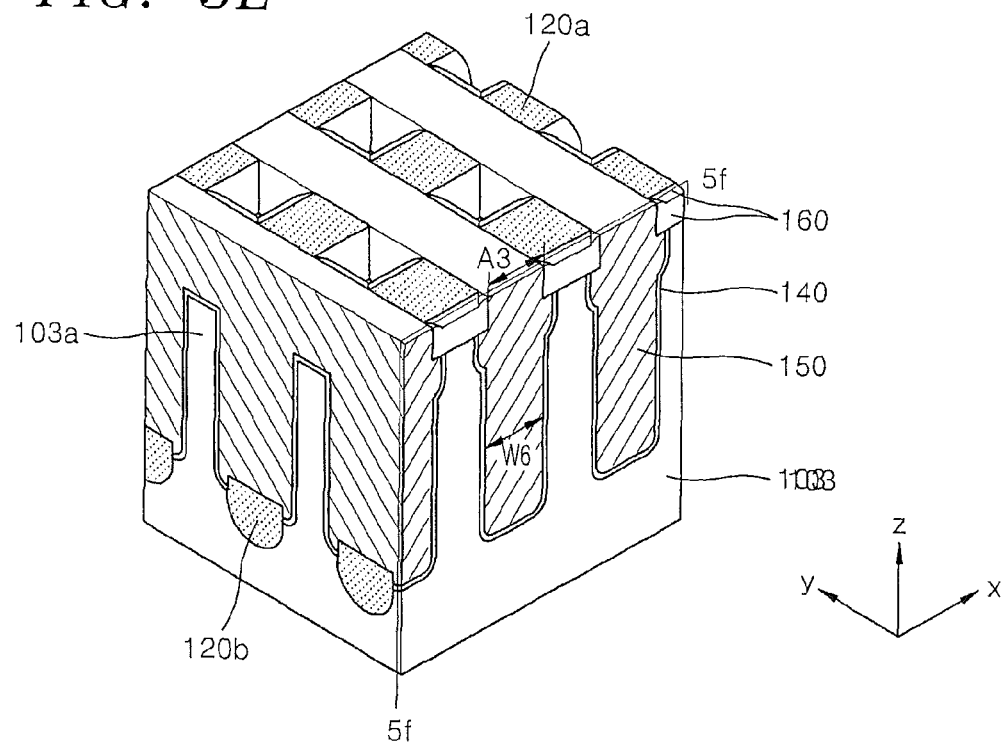

FIG. 5E is a perspective view illustrating a cross-section taken along line 5e-5e of FIG. 5D. The line 5e-5e of FIG. 5D represents a line taken deeper in the second (y) direction than line 5d-5d of FIG. 5C. As shown in FIG. 5E, the gate electrode 150 extends downward in order to cover side surfaces of the active regions 103a. The width "W6" of the lower portion of the gate electrode 150 is about the same as the width "A3" of a top portion of the gate electrode 150.

Figure 5F:
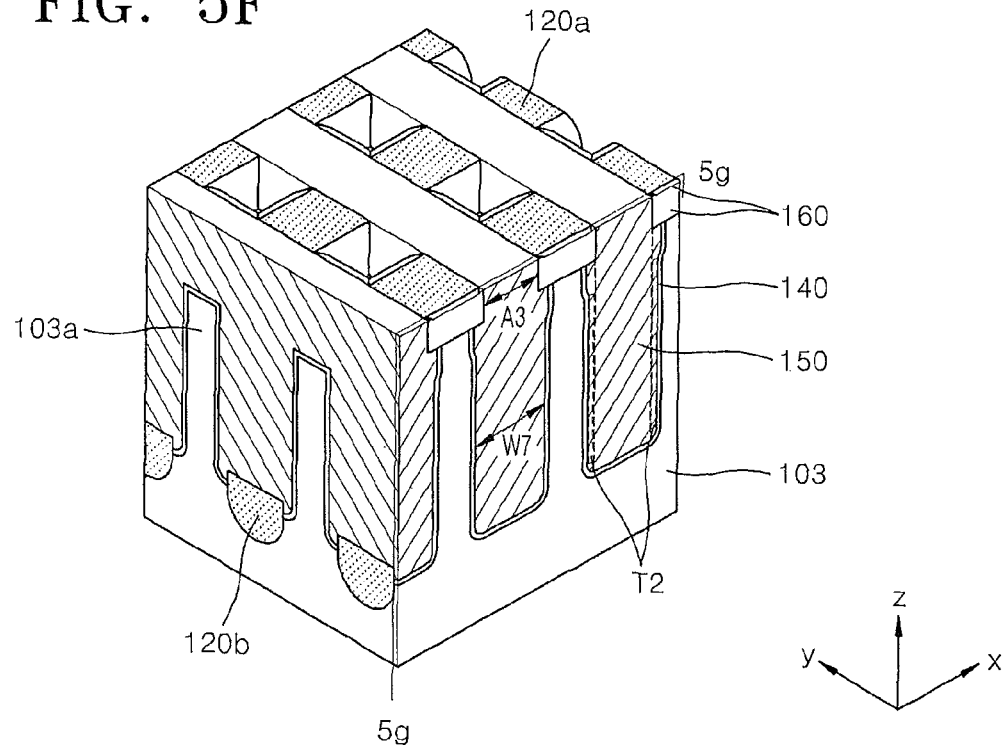

FIG. 5F is a perspective view illustrating a cross-section taken along line 5f-5f of FIG. 5E. The line 5f-5f of FIG. 5E is a line taken deeper in the second direction than the line 5e-5e. As shown in FIG. 5F, the width "W7" of the lower portion of the gate electrode 150 is greater than the width "A3" of the top portion of the gate electrode 150. From this, it can be seen that a terminal edge T2 of the side "contact surface" between the gate electrode 150 and the active region 103a is formed between the active region 103a and the device isolation layer 120a.

Figure 5G:
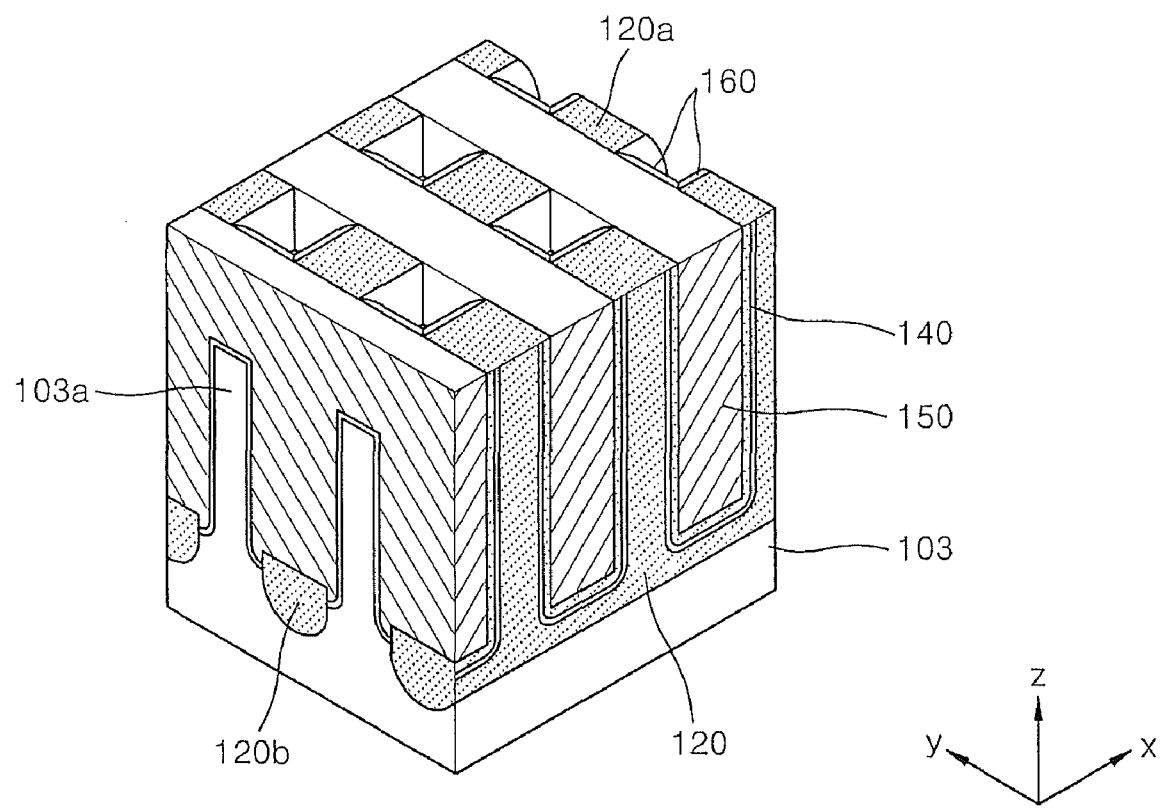

FIG. 5G is a perspective view illustrating a cross-section taken along line 5g-5g of FIG. 5F. The line 5g-5g of FIG. 5F is a line taken along side surfaces of the device isolation films 120, 120a and 120b. FIG. 5G illustrates the position of the gate insulation layer 140 on the side surfaces of the device isolation films 120, 120a and 120b. In the cross-section perpendicular to the second (y) direction of FIG. 5G, an outer portion of the device isolation film 120 covered by the gate insulation film 140 is adjacent to an unetched portion of the active region 103a, and the portion of the device isolation film covered by the gate insulation layer 140 is a portion that is filled by the gate electrode 150 immediately next to the line 5g-5g. In addition, the width of the gate electrode 150 decreases based on the cross-section perpendicular to the second (y) direction. Thus, the gate electrode 150 is self-aligned with the unetched active region 103a.

The field effect transistor as described above can be applied in flash memories, volatile memories, and other electronic devices that require highly integrated, high performance field effect transistors.

Hereinafter, methods of manufacturing field effect transistors according to embodiments of the present invention will be described with reference to the accompanying drawings.

Embodiments of the present invention also provide methods of manufacturing a field effect transistor. These methods may comprise: forming on a semiconductor substrate a first hard mask pattern corresponding to an active region; forming on the semiconductor substrate a device isolation film defining the active region; forming on the first hard mask pattern and the device isolation film a second hard mask pattern that exposes a portion on which a gate electrode is to be formed; anisotropic etching portions of the semiconductor substrate on which the active region is formed using the second hard mask pattern as an etching mask; subsequently isotropic etching the semiconductor substrate; forming a gate insulation layer on exposed surfaces of the semiconductor substrate; and forming a gate electrode by using the first hard mask pattern as a stopping layer using damascene.

Figure 6A:
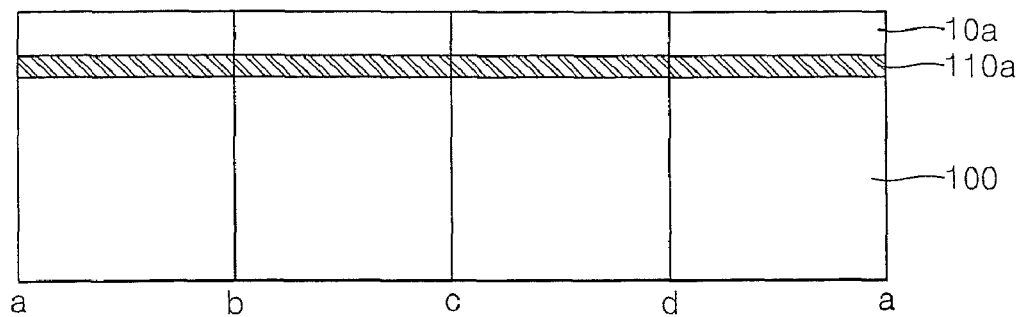
FIGS. 6A through 6O are cross-sectional views taken along line a-b-c-d-a of FIG. 1 that illustrate methods of manufacturing field effect transistors according to certain embodiments of the present invention.
Figure 6B:
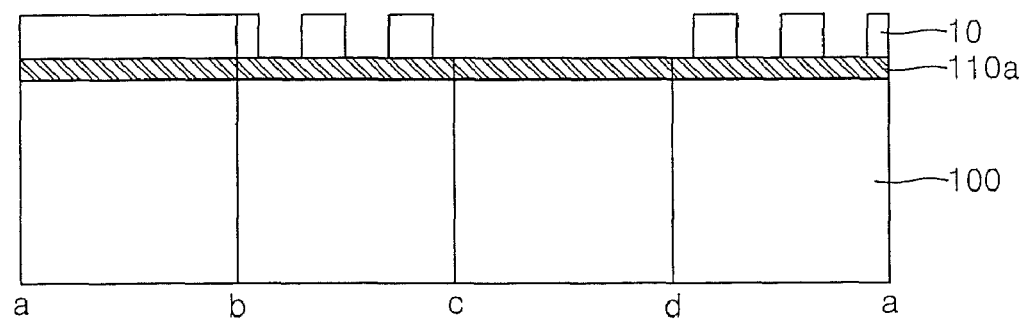
Figure 6C:
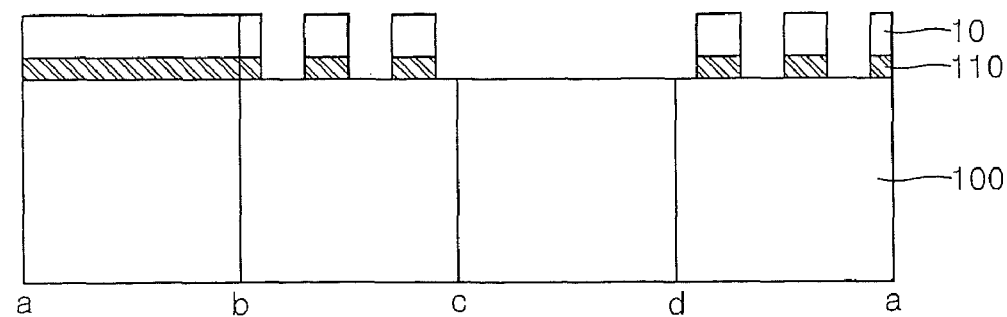
Figure 6D:
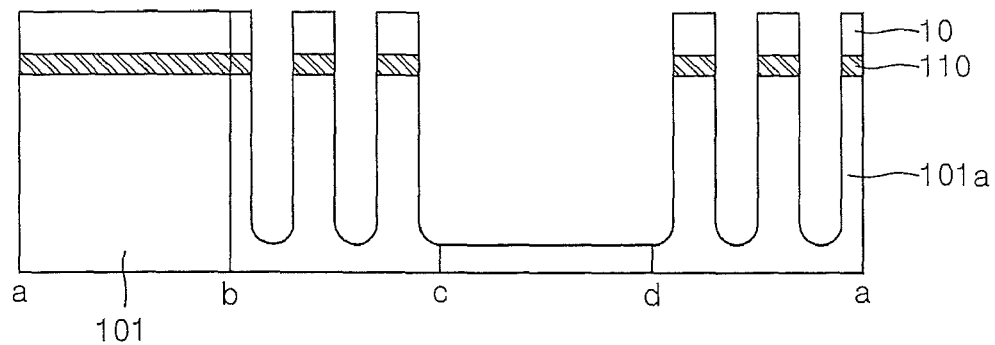
Figure 6E:
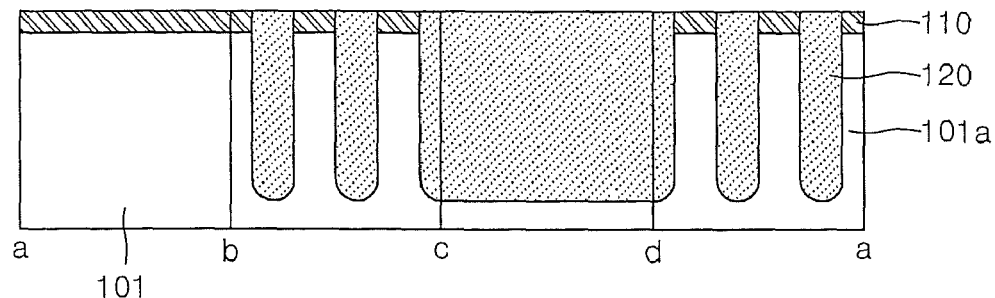
Figure 6F:
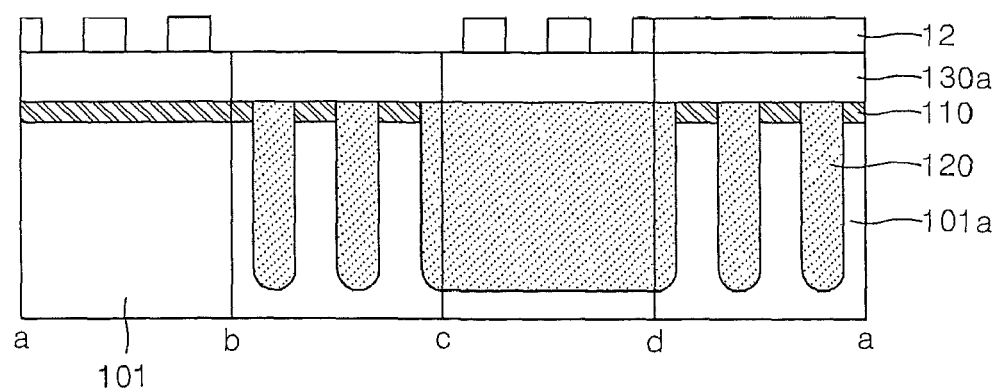
Figure 6G:
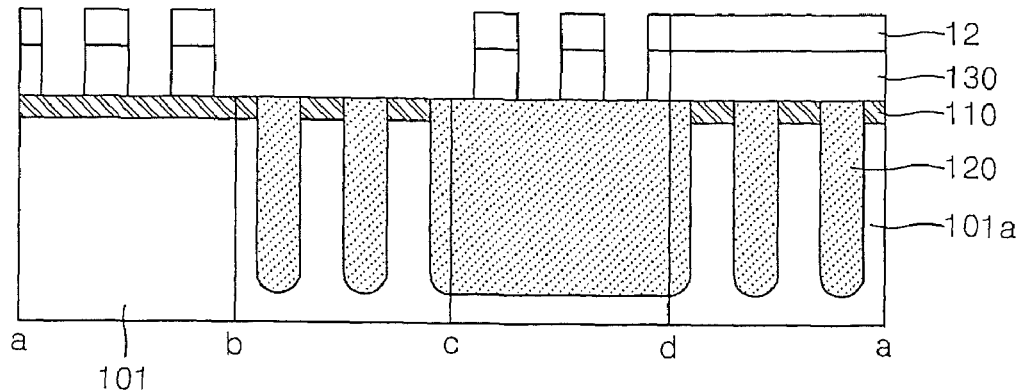
Figure 6H:
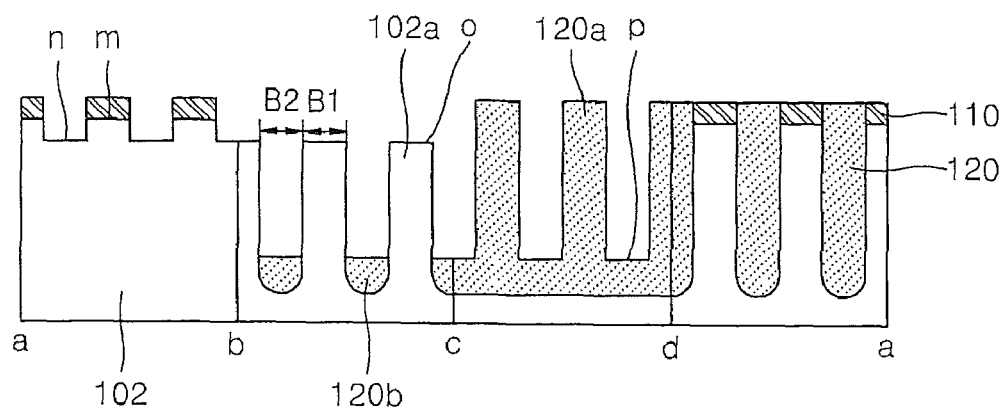
Figure 6I:
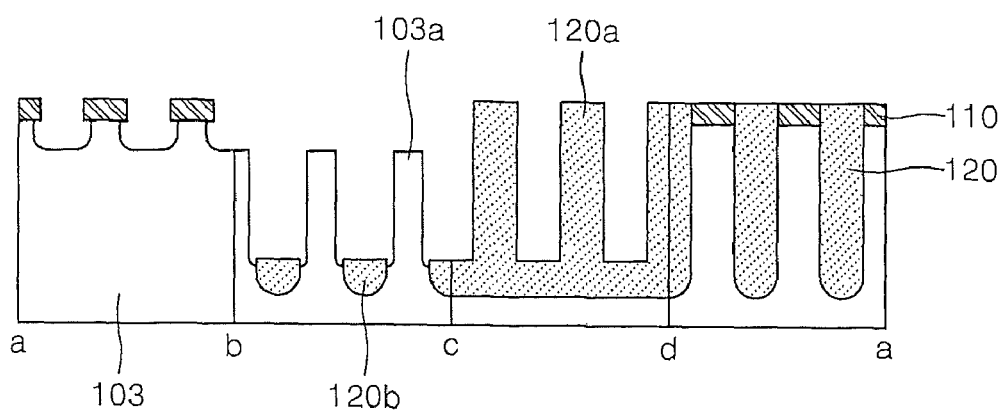
Figure 6J:
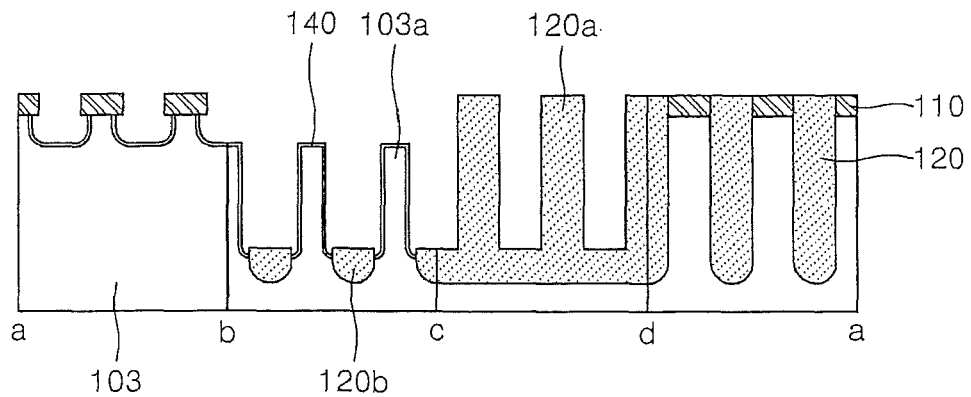
Figure 6K:
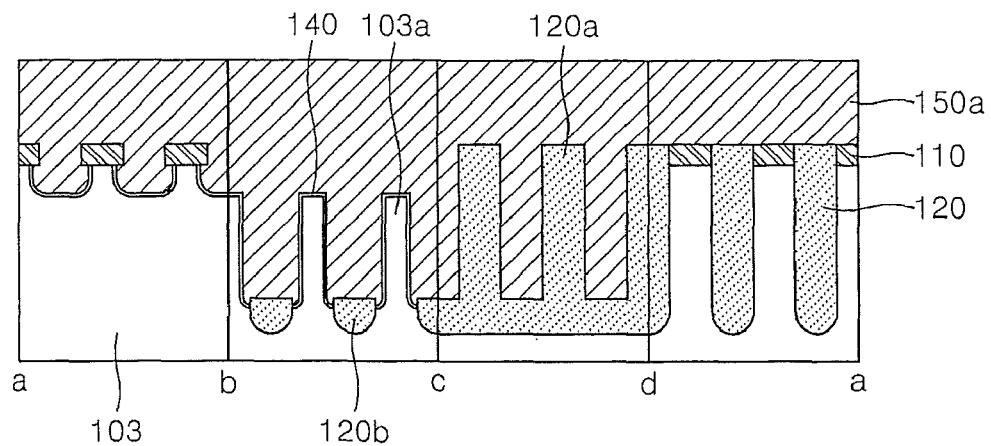
Figure 6L:
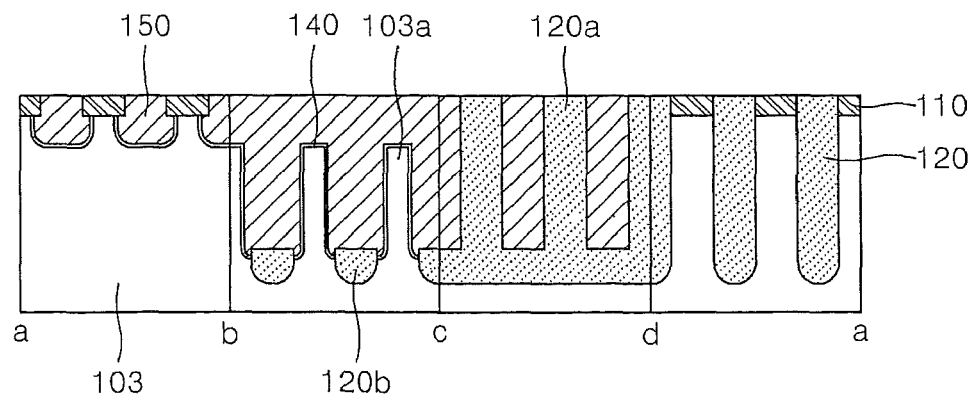
Figure 6M:
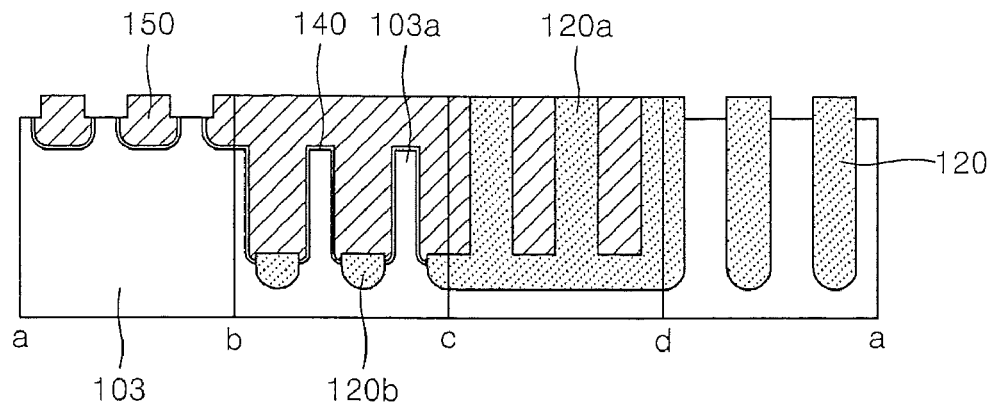
Figure 6N:
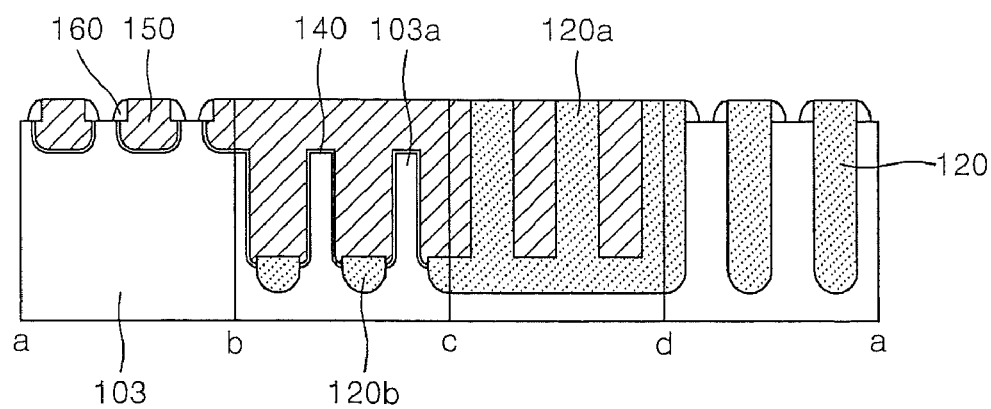
Figure 6O:
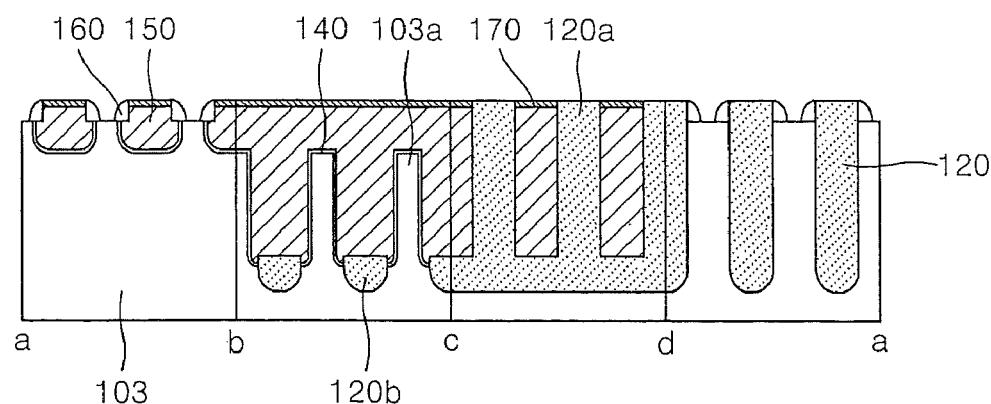

FIGS. 6A through 6O are cross-sectional views sequentially illustrating methods of manufacturing field effect transistors according to embodiments of the present invention. The cross-sectional views of FIGS. 6A through 6O are taken along line a-b-c-d-a of FIG. 1. FIGS. 7A through 7H are plan views illustrating the top surface of the field effect transistors taken along line a-b-c-d-a of FIG. 1. FIGS. 7A through 7H correspond to FIGS. 6E, 6G, 6H, 6I, 6J, 6L, 6M, and 6N, respectively.

Referring to FIG. 6A, a first hard mask pattern layer 110a is formed on a semiconductor substrate 100, and a photosensitive layer 10a is formed thereon for forming the first hard mask pattern. The first hard mask pattern layer 110a may comprise, for example, a silicon nitride film or polysilicon film, and may for example, be deposited by chemical vapor deposition (CVD). The photosensitive layer 10a may be a photoresist layer, and may be deposited by, for example, spin coating or the like.

Referring to FIG. 6B, the photosensitive layer 10a is exposed to light and developed to form a photosensitive mask 10. Referring to FIG. 6C, an anisotropic etching step is performed using the photosensitive mask 10 as an etch mask to form a first hard mask pattern 110 that extends in a first (x) direction.

Referring to FIG. 6D, an anisotropic etch is performed on the exposed semiconductor substrate using the photosensitive mask 10 and the first hard mask pattern 110 as a mask to form trenches and obtain a semiconductor substrate 101 in which active regions 101a are defined.

Referring to FIG. 6E, next, device isolation films 120 may be formed in order to separate devices. The device isolation films 120 may be formed by depositing an insulation layer (not shown) that covers the first hard mask pattern 110 by CVD, high density plasma (HDP), or the like, and then performing chemical mechanical polishing (CMP) using the first hard mask pattern 110 as a stopping layer to form the device isolation films 120. The insulation layer (and hence the device isolation films 120) may be formed, for example, of silicon oxide ($SiO_2$).

Figure 7A:
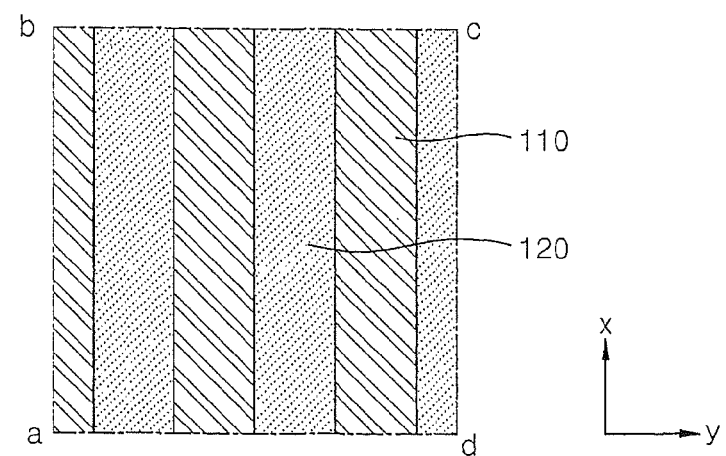
FIGS. 7A through 7H are plan views of the structures of FIGS. 6E, 6G, 6H, 6I, 6J, 6L, 6M, and 6N, respectively.

FIG. 7A is a plan view of the structure of FIG. 6E. Referring to FIG. 7A, the first hard mask patterns 110 are on the active regions (not shown), and are separated from each other by the device isolation films 120.

Referring to FIGS. 6F and 6G, next a second hard mask pattern 130 that exposes a portion of the structure on which a gate electrode is to be formed is formed on the first hard mask pattern 110 and the device isolation films 120. The second hard mask pattern 130 may be formed by depositing a second hard mask pattern layer 130a on the first hard mask pattern 110 and the device isolation films 120, and then forming a photosensitive layer (not shown) on the second hard mask pattern layer 130a. The photosensitive layer may then be exposed to light and developed to form an etching mask 12 that is used to form the second hard mask pattern 130. As shown in FIG. 6G, the second hard mask pattern layer 130a is etched using the etching mask 12 to form the second hard mask pattern 130. After the formation of the second hard mask pattern 130, the etching mask 12 can be removed by ashing, or can be left in place to protect the second hard mask pattern 130 in a subsequent etching process.

Figure 7B:
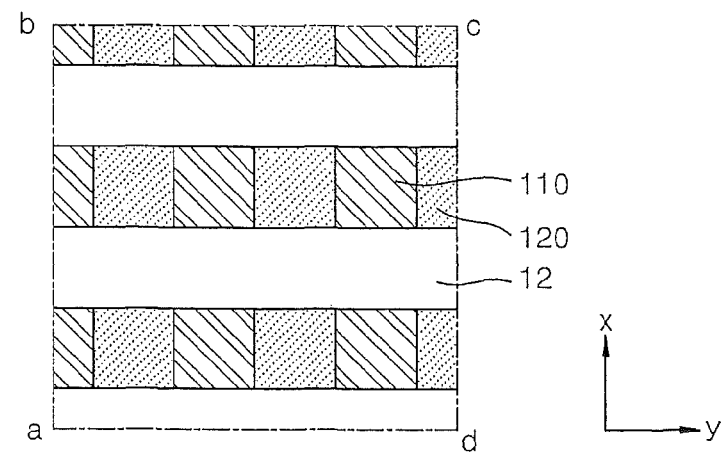

FIG. 7B is a plan view of the structure of FIG. 6G. Referring to FIG. 7B, the etching masks 12 are arranged in a second (y) direction that is perpendicular to the first (x) direction in which the device isolation films 120 are arranged.

An anisotropic etch may then be performed using the second hard mask pattern 130 as a mask to form the structure shown in FIG. 6H. As shown in FIG. 6H, portions of the semiconductor substrate 103 and device isolation layer 120 that are covered by the second hard mask pattern 130 are not etched, whereas exposed portions of the semiconductor substrate 103 and device isolation layer 120 are etched. As a result, a step is formed between a top portion of an active region (labeled "m" in FIG. 6H) that is screened by the second hard mask pattern 130 and a top portion of an active region (labeled "n" in FIG. 6H) that is not screened by the second hard mask pattern 130. In addition, due to differences in the etching selectivity of the first hard mask pattern 110, the semiconductor substrate 101 and the device isolation films 120, portions of the semiconductor substrate 101 that were protected by the first hard mask pattern 110 may only be thinly etched to a predetermined depth (labeled "o" in FIG. 6H), whereas directly exposed portions of the device isolation films 120b are more deeply etched (labeled "p" in FIG. 6H). The anisotropic etching should be stopped before the directly exposed device isolation films 120 are completely etched, and thus a portion of the device isolation films (labeled 120b in FIG. 6H) remain covering the semiconductor substrate 101 at the completion of this etching step.

Figure 7C:
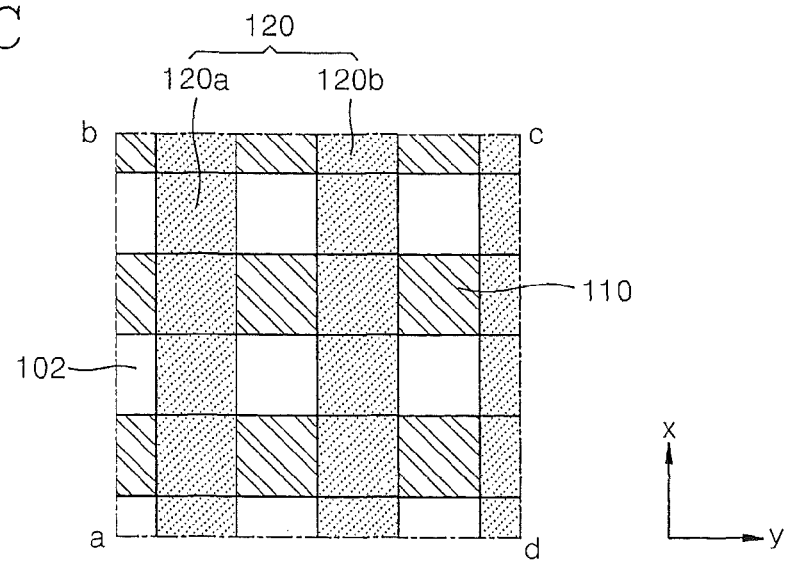

FIG. 7C is a plan view of the structure of FIG. 6H. Referring to FIG. 7C, it can be seen that portions of the semiconductor substrate 102 are exposed by the anisotropic etching.

In addition, portions screened by the second hard mask pattern (not shown) and the etching masks 12 in FIG. 7B remain with the first hard mask pattern 110 not being etched. In addition, a step is formed between the device isolation films 120 depending on whether the device isolation films 120 are screened by the second hard mask pattern (not shown). In FIG. 7C, device isolation films 120a that are formed in the same horizontal row as a row in which the first hard mask pattern 110 remains are not etched, and device isolation films 120b that are not formed in the same horizontal row as a row in which the first hard mask pattern 110 remains are etched. Thus, the height of the device isolation films 120a is relatively higher than the height of the device isolation films 120b (see also FIG. 6H). As a result, side surfaces of the active regions 102a are exposed on left and right sides of the device isolation films 120b.

Referring to FIG. 6I, an isotropic etch is performed on the exposed active regions 102a. Consequently, exposed surfaces of the active regions 102a are conformally recessed to a predetermined depth to form active regions 103a, as illustrated in FIG. 6I. However, the device isolation films 120 and the first hard mask pattern 110 are not substantially etched by the isotropic etching, and thus their profiles may remain substantially what they were prior to the etching step. As can be seen in the cross-sectional view of the field effect transistor taken along the line b-c of FIG. 6I, terminal edges of lower portions of the active regions 103a are positioned below top surfaces of the device isolation films 120b that are adjacent to the active regions 103a and are deeply etched by the isotropic etching.

The etchant used in the isotropic etching may, for example, be a mixed solution of nitric acid and hydrogen peroxide. The etching rate of the etchant may be adjusted to a range of, for example, about 20 to 40 nm/min.

FIG. 8, which is an exploded perspective view of the structure of FIG. 6I, more fully illustrates the structure that results from the isotropic etching. As shown in FIG. 8, the active region 103a has a curved etched surface. That is, side surfaces of the active regions 103a that are exposed by the deeply etched device isolation films 120b are conformally etched. In addition, side surfaces of the active regions 103a that are screened by the device isolation films 120a are partially etched, and particularly have a curved etched surface. The curved etched surface may be in the form of the profile illustrated in FIG. 8.

Figure 7D:
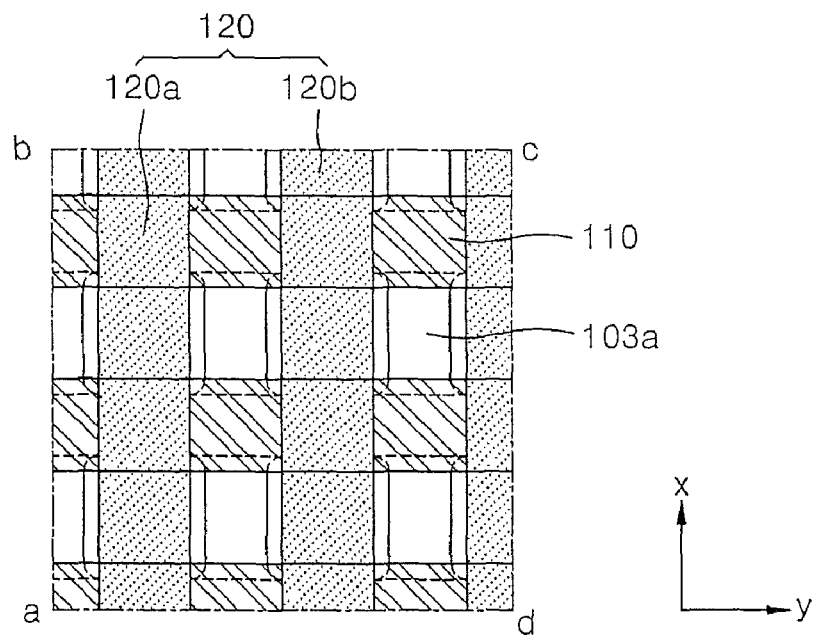

FIG. 7D is a plan view of the structure of FIG. 6I. Referring to FIG. 7D, the active regions 103a are etched downward by the isotropic etching and the left-to-right width of the active regions 103a decreases. In addition, exposed side surfaces of the semiconductor substrate 103a formed below the first hard mask pattern 110 are partially etched by the isotropic etching.

Figure 7E:
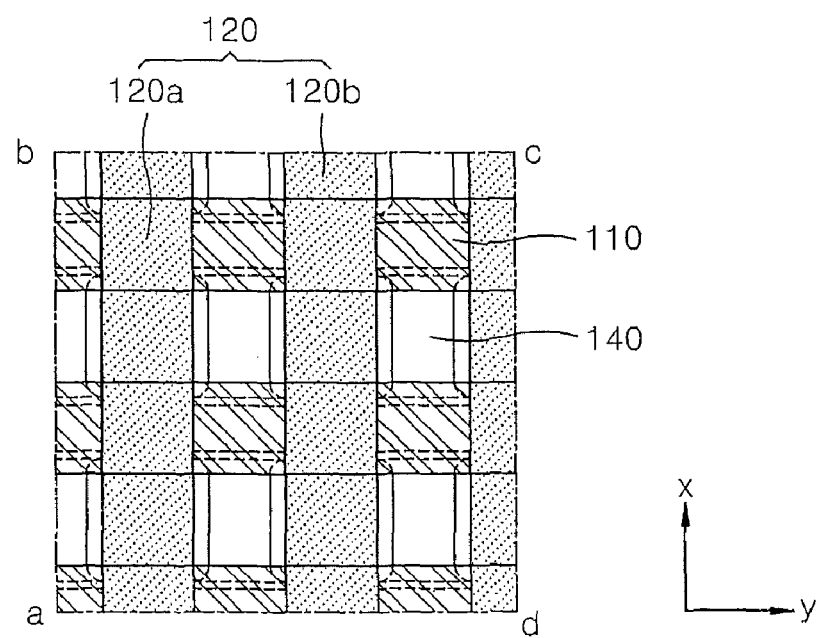

Referring to FIG. 6J, a gate insulation layer 140 is formed on the exposed active regions 103a. The gate insulation layer 140 need not be formed on the first hard mask pattern 110, and thus may be formed by thermally oxidizing the active regions 103a. FIG. 7E is a plan view of the structure of FIG. 6J. As shown in FIG. 7E, the gate insulation layer 140 is formed on the active regions 103a.

Figure 7F:
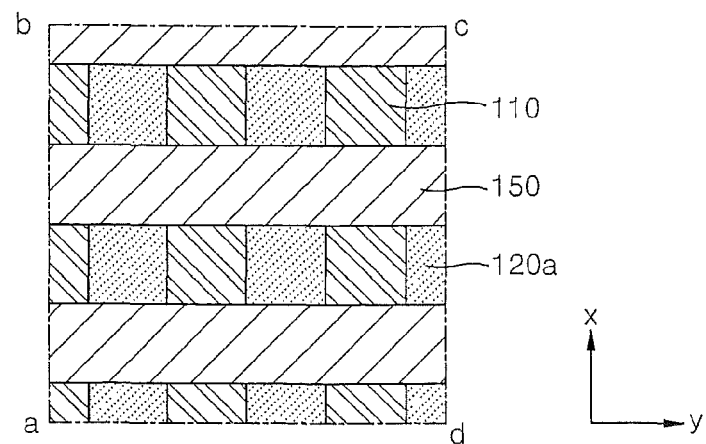

Referring to FIGS. 6K and 6L, a gate electrode layer 150a may be formed on the gate insulation layer 140, the device isolation films 120a and 120b and the first hard mask pattern 110. Then, a gate electrode 150 may be formed by planarizing the gate electrode layer 150a using damascene using the first hard mask pattern 110 as a stopping layer. The planarizing may be performed, for example, by chemical mechanical polishing (CMP) or etch back. FIG. 7F is a plan view of the structure of FIG. 6L. As shown in FIG. 7F, the gate electrode 150 is formed on the deeply etched device isolation films 120b. Although not illustrated in FIG. 7F, the gate electrode 150 is formed in spaces formed by isotropic etching the exposed side surfaces of the semiconductor substrate 102 formed below the first hard mask pattern 110.

Figure 7G:
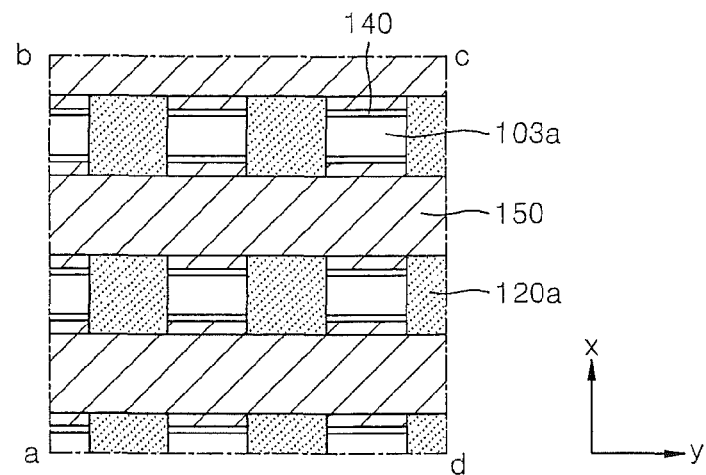

Referring to FIG. 6M, the first hard mask pattern 110 is removed, for example, by wet etching using an acidic solution such as phosphoric acid. FIG. 7G is a plan view of the structure of FIG. 6M. As shown in FIG. 7G, the active regions 103a are exposed by the removal of the first hard mask pattern 110, and the active regions 103a contact the gate electrode 150 with the gate insulation film 140 intervening therebetween. A step exists between a portion of the gate electrode 150 protruding in the first (x) direction and a portion of the gate electrode 150 extending in the second (y) direction.

Optionally, a low concentration of impurities may be implanted using the gate electrode 150 as a mask to form a source/drain region.

Figure 7H:
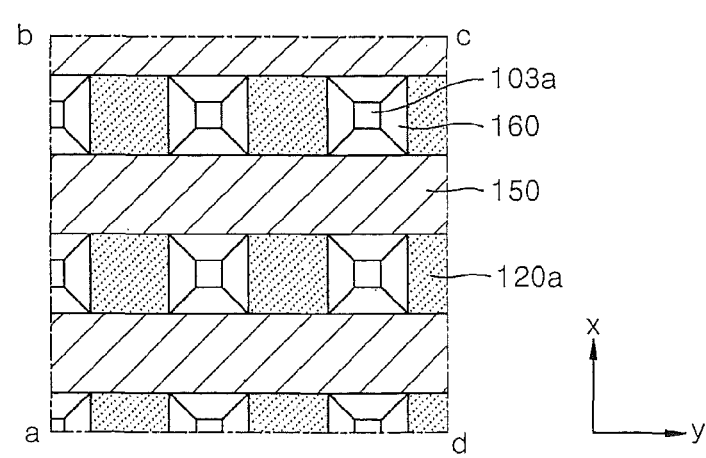

Referring to FIG. 6N and FIG. 7H (which is a plan view of the structure of FIG. 6N), an insulating film (not shown) may be formed on the gate electrodes 150, the device isolation films 120 and the semiconductor substrate 103. Then, the insulating film may be etched to form spacers 160.

Optionally, after the formation of the spacers 160, a high concentration of impurities may be implanted using the gate electrodes 150 and the spacers 160 as a mask to form a source/drain region having a lightly doped drain (LDD) structure.

Optionally, a capping layer 170 may be further formed on the gate electrodes 150. The capping layer 170 may be formed by etching the gate electrodes 150 before the first hard mask pattern 110 is removed, and then depositing a capping material on top surfaces of the gate electrodes 150. The capping material may then be planarized using the first hard mask pattern 110 as a stopping layer (see FIG. 6O).

Optionally, when the first hard mask pattern 110 is formed, the width thereof may be larger than the width of the device isolation film 120b. As a result, the width (B1 of FIG. 6H) of the active region 102a can be larger than the width (B2 of FIG. 6H) of the device isolation film 120b. When the width of the active region 102a (B1) is larger than the width of the device isolation film 120b (B2), the isotropic etching can be performed until the width of an upper portion of the active region 102a is the same as the width of the device isolation film 120b. This may keep the cross-section of the active region 102a from being excessively thin or sharp due to the isotropic etching, resulting in contribution to the stability of device characteristics.

Field effect transistors according to embodiments of the present invention can be manufactured by the manufacturing methods described above. These field effect transistors can exhibit stable device characteristics even when highly integrated in such a manner that both the length and width of a channel can be increased and particularly the channel can be significantly long.

Figure 9:
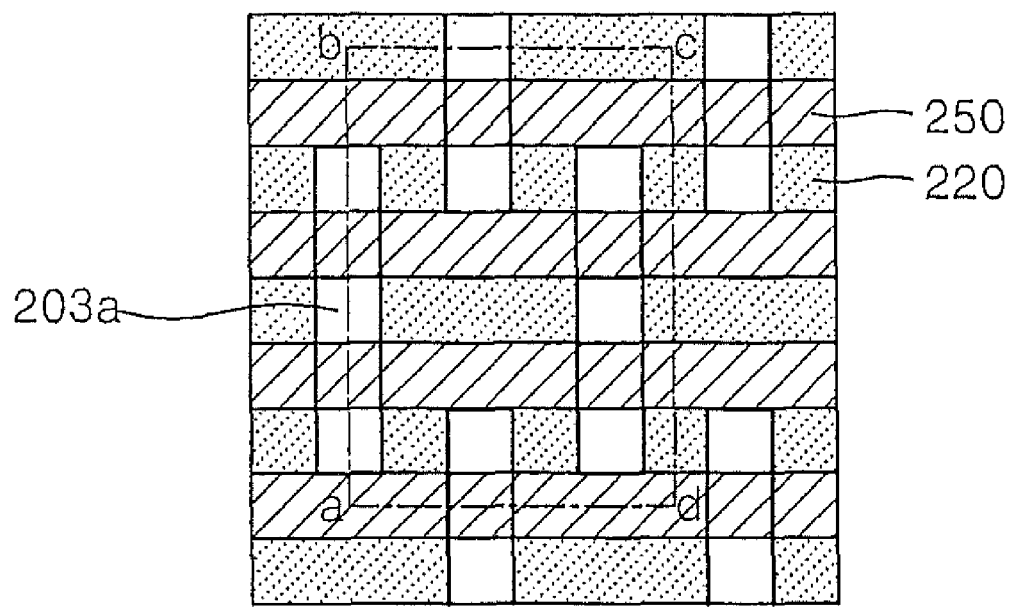
FIG. 9 is a plan view conceptually illustrating an array of field effect transistors according to further embodiments of the present invention.
Figure 10A:
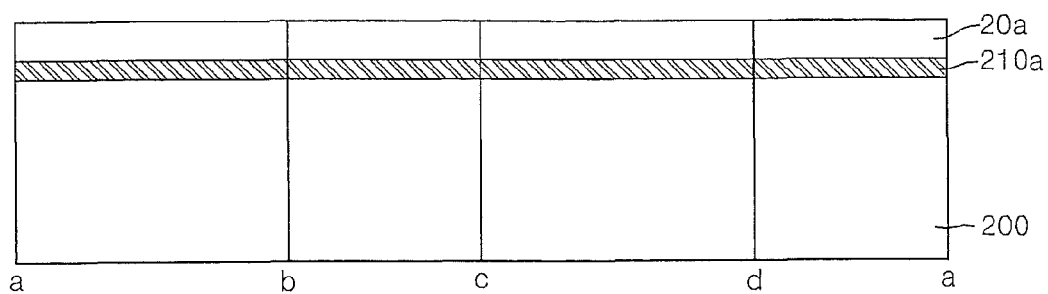
FIGS. 10A through 10O are cross-sectional views taken along line a-b-c-d-a of FIG. 9 that illustrate methods of manufacturing field effect transistors according to further embodiments of the present invention.

FIG. 9 is a plan view conceptually illustrating an array of field effect transistors according to further embodiments of the present invention. FIGS. 10A through 10N are cross-sectional views taken along the line a-b-c-d-a of FIG. 1 that illustrate methods of manufacturing field effect transistors according to these further embodiments of the present invention.

Referring to FIG. 10A, a first hard mask pattern layer 210a and a photosensitive layer 20a are sequentially formed on a semiconductor substrate 200. The configuration and formation method of each of the layers 210a, 20a and 200 may be the same as described in FIG. 6A, and thus further description therefore is omitted here.

Figure 10B:
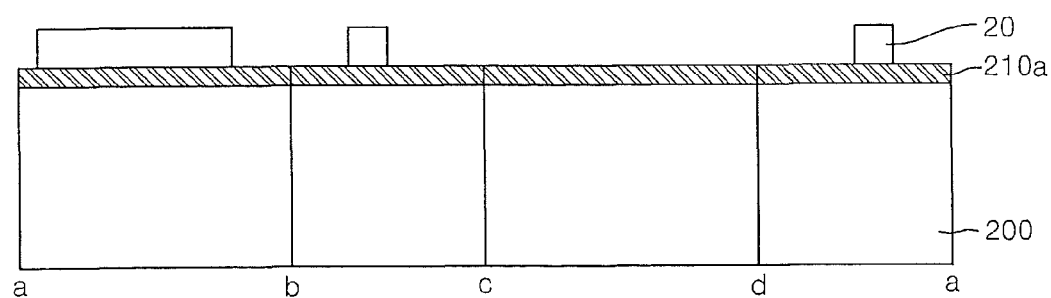
Figure 10C:
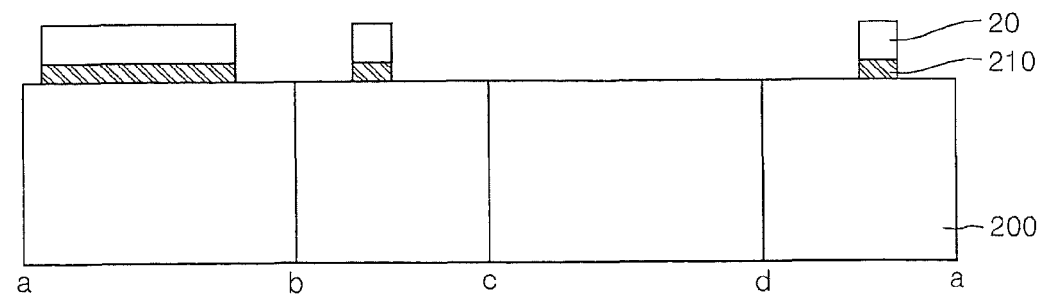

Referring to FIGS. 10B and 10C, the photosensitive layer 20a is exposed to light and developed to form a photosensitive mask 20, and an anisotropic etch is performed using the photosensitive mask 20 to form a first hard mask pattern 210.

Figure 10D:
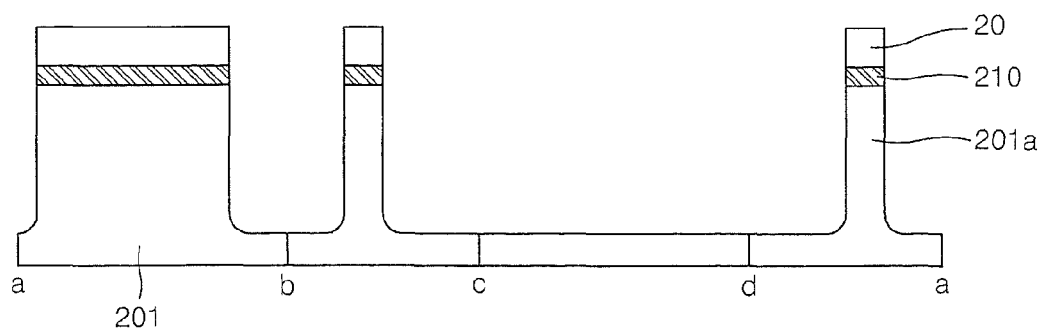
Figure 10E:
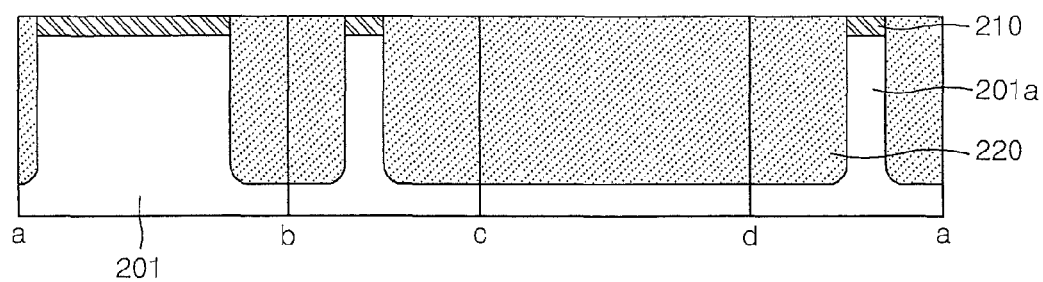

Referring to FIGS. 10D and 10E, an anisotropic etch is performed using the photosensitive mask 20 and the first hard mask pattern 210 as an etching mask to form trenches and obtain a semiconductor substrate 201 in which active regions 201a are defined. Next, an insulation layer (not shown) is formed to cover the first hard mask pattern 210, and then chemical-mechanical polishing may be performed using the first hard mask pattern 210 as a stopping layer to form device isolation films 220.

Figure 10F:
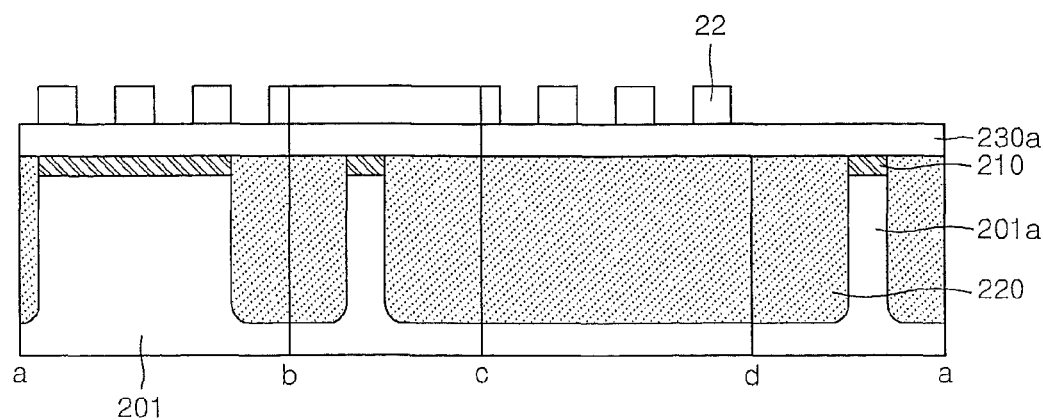
Figure 10G:
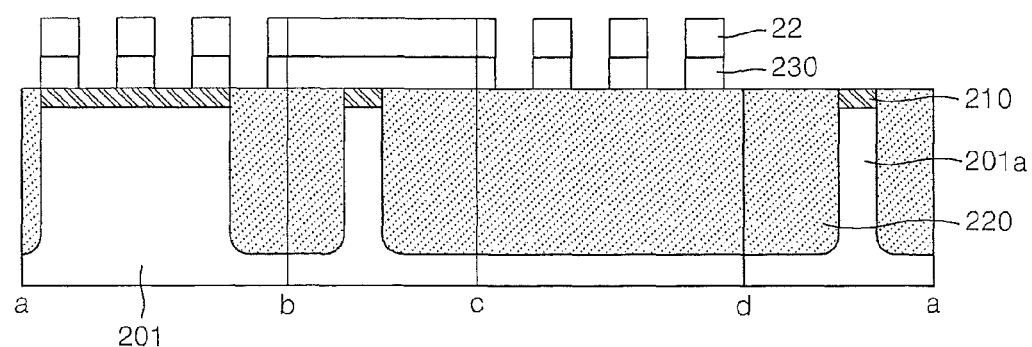

Next, a second hard mask pattern 230 is formed on the first hard mask pattern 210 and the device isolation films 220. In particular, as shown in FIG. 10F, a second hard mask pattern layer 230a is formed, a photosensitive layer (not shown) is formed thereon, and then the photosensitive layer is exposed to light and developed to form an etching mask 22 that is used in forming the second hard mask pattern 230. Referring to FIG. 10G, the second hard mask pattern layer 230a is etched using the etching mask 22 to form the second hard mask pattern 230.

Figure 10H:
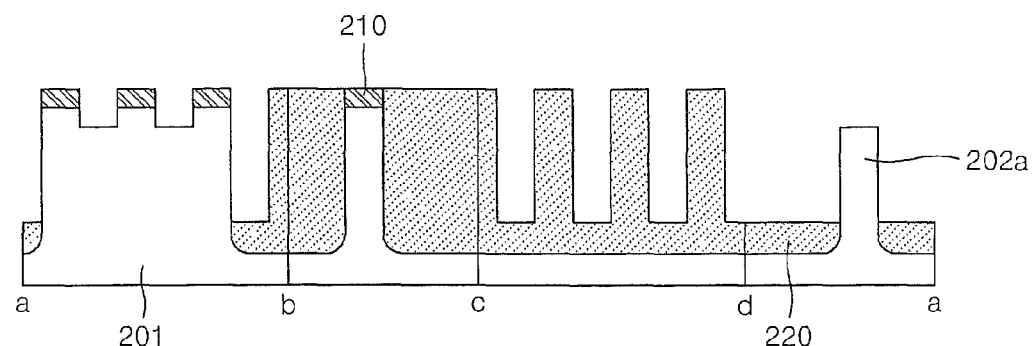

An anisotropic etch is performed using the second hard mask pattern 230 as an etching mask to form the structure of FIG. 10H. As in the case of FIG. 6H, portions covered by the second hard mask pattern 230 are not etched and portions of the active regions 202a and device isolation films 220 that are not screened by the second hard mask pattern 230 are etched. In addition, due to the etching selectivity of the active region 202a and the device isolation film 220, there is a difference between the etched heights thereof.

Figure 10I:
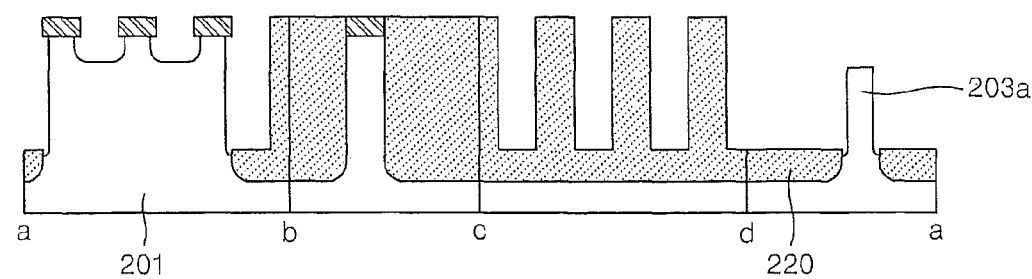

Referring to FIG. 10I, an isotropic etching is performed on the exposed active region 202a in the structure of FIG. 10H. The exposed active region 202a is recessed to a predetermined depth by the isotropic etching to form an active region 203a as illustrated in FIG. 10I. As can be seen in the cross-sectional view taken along the line d-a of FIG. 10I, terminal edges of a lower portion of the active region 203a are positioned below top surfaces of the device isolation films 220 that are adjacent to the active region 203a and are deeply etched by the isotropic etching.

Figure 10J:
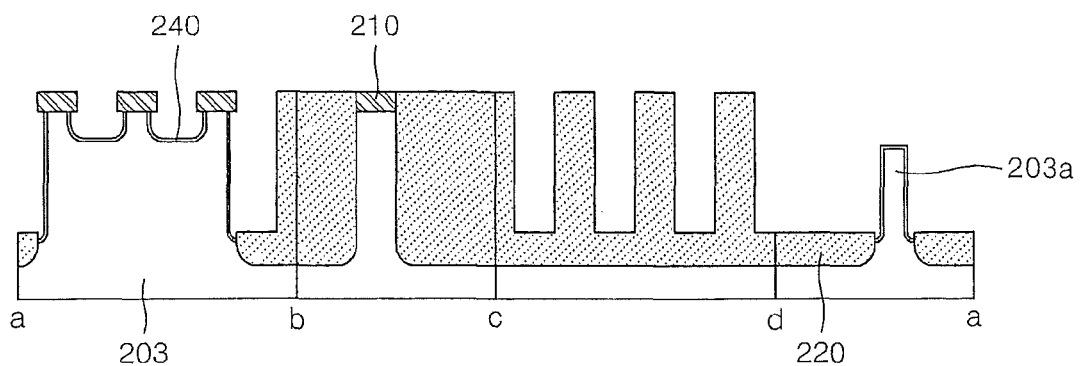

Referring to FIG. 10J, a gate insulation layer 240 is formed on the recessed active region 203a. The gate insulation layer 240 may be formed by thermal oxidation.

Figure 10K:
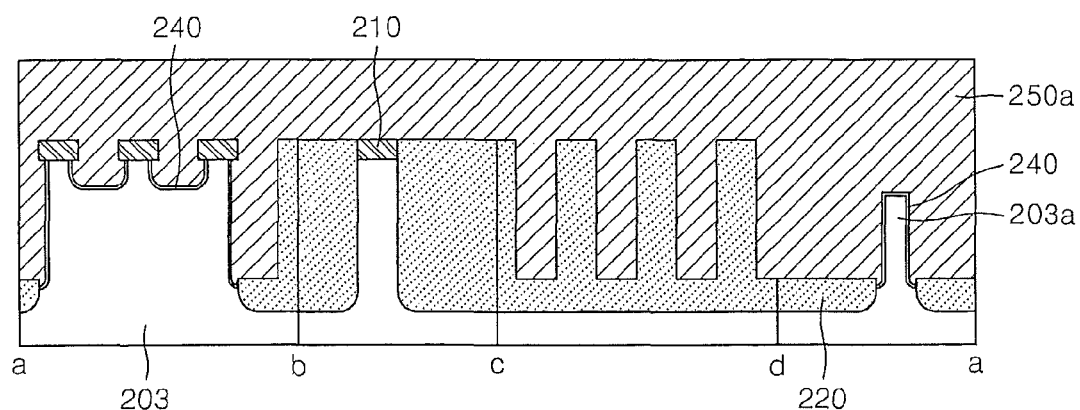
Figure 10L:
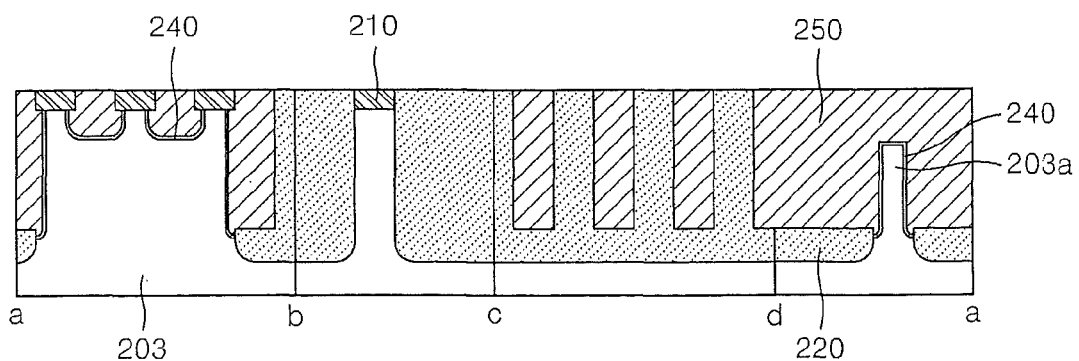

Referring to FIGS. 10K and 10L, a gate electrode film 250a is formed on the gate insulation layer 240, the device isolation films 220 and the first hard mask pattern 210. Then, a gate electrode 250 is formed by planarizing the gate electrode film 250a using damascene using the first hard mask pattern 210 as a stopping layer.

Figure 10M:
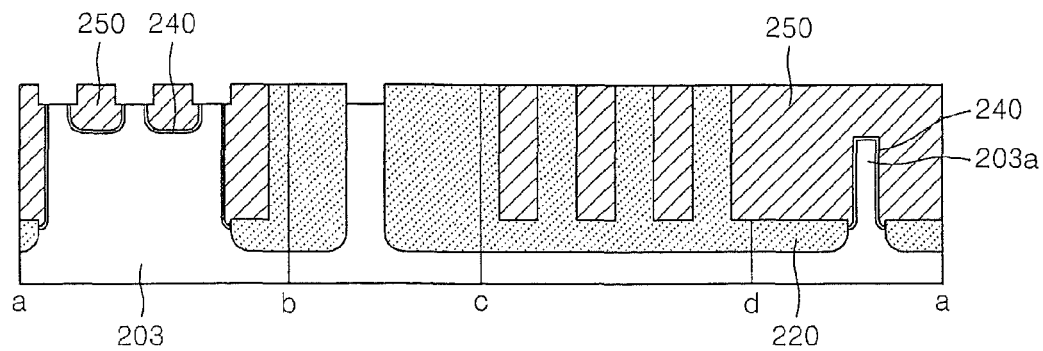
Figure 10N:
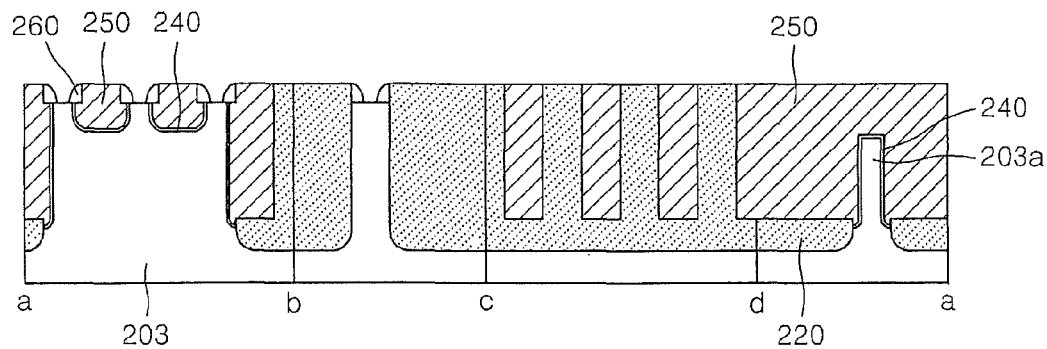

Referring to FIG. 10M, the first hard mask pattern 210 is removed, and a low concentration of impurities is implanted using the gate electrode 250 as a mask to form a source/drain region.

Referring to FIG. 10N, an insulating film (not shown) for forming a spacer is formed on the gate electrodes 250, the device isolation films 220 and the semiconductor substrate 203. Then, the insulating film is etch-backed to form spacers 260. Optionally, after the formation of the spacers 260, a high concentration of impurities is implanted using the gate electrodes 250 and the spacers 260 as a mask to form a source/drain region having a LDD structure.

Figure 10O:
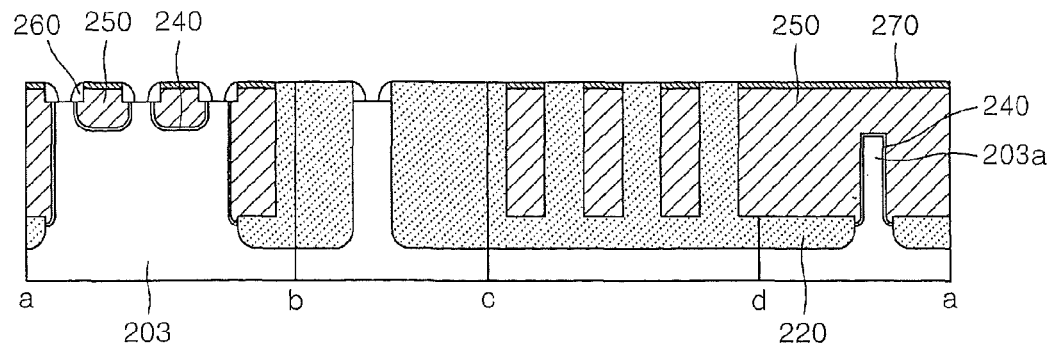

Optionally, a capping layer 270 may also be formed on the gate electrodes 250. This capping layer 270 may be formed by etching the gate electrodes 250 before the first hard mask pattern 210 is removed, and then depositing a capping material on top surfaces of the gate electrodes 250. The capping material can be planarized using the first hard mask pattern 210 as a stopping layer (refer to FIG. 10O) to form the capping layer 270.

Embodiments of the present invention also encompass electronic devices including these field effect transistor. The electronic devices may be any one of volatile memory devices, non-volatile memory devices, computers, mobile phones, display devices, audios, MP3 players, and the like.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A field effect transistor comprising:
a semiconductor substrate;
an active region extending in a first direction (x-direction) in the semiconductor substrate, a portion of the active region having a top surface lower than other portions of the active region and the portion of the active region being recessed at both side surfaces in a second direction (y-direction) perpendicular to side surfaces of the active region and the second direction being perpendicular to the first direction;
a device isolation film that extends along the first direction; and
a gate electrode at least partially contacting the recessed portion of the active region with a gate insulation layer interposed therebetween.

2. The field effect transistor of claim 1, wherein a top surface of the active region is higher than a top surface of the semiconductor substrate on either side of the active region so that the active region extends above the recessed portion of the semiconductor substrate.

3. The field effect transistor of claim 1, wherein the gate electrode covers a top surface and first and second side surfaces of the active region.

4. The field effect transistor of claim 1, wherein top surfaces of terminal edges of lower portions of the active region are positioned below top surfaces of portions of the device isolation film that are adjacent to the terminal edges of lower portions of the active region.

5. The field effect transistor of claim 1, wherein the gate electrode extends in a second direction that is substantially perpendicular to the first direction.

6. The field effect transistor of claim 1, wherein portions of the active region that are covered by the gate electrode have curved surfaces.

7. The field effect transistor of claim 6, wherein the curved surfaces form a saddle shape.

8. The field effect transistor of claim 1, wherein a top surface of a first portion of the active region that is covered by the gate electrode is lower than a top surface of a second portion of the active region that is between the gate electrode and an adjacent gate electrode.

9. The field effect transistor of claim 1, wherein a portion of the active region is recessed in a third direction (z-direction) perpendicular to a main surface of the semiconductor substrate.

10. A memory device including a field effect transistor, the field effect transistor comprising:

a semiconductor substrate;

an active region extending in a first direction (x-direction) in the semiconductor substrate, a portion of the active region having a top surface lower than other portions of the active region and the portion of the active region being recessed at both side surfaces in a second direction (y-direction) perpendicular to side surfaces of the active region and the second direction being perpendicular to the first direction;

a device isolation film that extends along the first direction; and a gate electrode at least partially contacting the recessed portion of the active region with a gate insulation layer interposed therebetween.

11. The memory device of claim 10, wherein a portion of the semiconductor substrate is recessed along opposed sides of the active region so that the active region extends above the recessed portion of the semiconductor substrate.

12. The memory device of claim 10, wherein the gate electrode covers a top surface and first and second side surfaces of the recessed portion of the active region.

13. The memory device of claim 10, wherein portions of the active region that are covered by the gate electrode have curved surfaces.

14. The memory device of claim 13, wherein the curved surfaces form a saddle shape.

15. An electronic device including a field effect transistor, the field effect transistor comprising:

a semiconductor substrate;

an active region extending in a first direction (x-direction) in the semiconductor substrate, a portion of the active region having a top surface lower than other portions of the active region and the portion of the active region being recessed at both side surfaces in a second direction (y-direction) perpendicular to side surfaces of the active region and the second direction being perpendicular to the first direction;

a device isolation film that extends along the first direction; and a gate electrode at least partially contacting the recessed portion of the active region with a gate insulation layer interposed therebetween.

16. The electronic device of claim 15, wherein a portion of the semiconductor substrate is recessed along opposed sides of the active region so that the active region extends above the recessed portion of the semiconductor substrate.

17. The electronic device of claim 15, wherein the gate electrode covers a top surface and first and second side surfaces of the recessed portion of the active region.

18. The electronic device of claim 15, wherein portions of the active region that are covered by the gate electrode have curved surfaces.

19. The electronic device of claim 18, wherein the curved surfaces form a saddle shape.

* * * * *